(12) United States Patent
Fuji et al.

(10) Patent No.: US 7,175,963 B2
(45) Date of Patent: Feb. 13, 2007

(54) CHEMICAL AMPLIFICATION TYPE POSITIVE RESIST COMPOSITION AND A RESIN THEREFOR

(75) Inventors: Yusuke Fuji, Ibaraki (JP); Yoshiyuki Takata, Toyonaka (JP); Isao Yoshida, Ikeda (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 10/952,793

(22) Filed: Sep. 30, 2004

(65) Prior Publication Data

US 2005/0100819 A1 May 12, 2005

(30) Foreign Application Priority Data

Oct. 3, 2003 (JP) .............................. 2003-345471

(51) Int. Cl.
 *G03C 1/73* (2006.01)
 *G03F 7/039* (2006.01)
(52) U.S. Cl. ................... 430/270.1; 430/326; 430/910; 430/921; 430/925
(58) Field of Classification Search ............. 430/270.1, 430/910, 905, 326, 921, 925
 See application file for complete search history.

(56) References Cited

U.S. PATENT DOCUMENTS 6,576,392 B1 * 6/2003 Sato et al. ............... 430/270.1

FOREIGN PATENT DOCUMENTS

| EP | 1000924 A1 | 5/2000 |
| EP | 1 338 922 A2 * | 8/2003 |
| JP | 2003-131382 A | 5/2003 |

OTHER PUBLICATIONS

Machine-assisted English translation for JP 2003-131382, provided by JPO.*
Chem. Abstract 138:376397 - English abstract for JP 2003-131382.*

* cited by examiner

*Primary Examiner*—Sin Lee
(74) *Attorney, Agent, or Firm*—Birch, Stewart, Kolasch and Birch, LLP

(57) ABSTRACT

A resin which comprises (1) at least one structural unit selected from the group consisting of a structural unit derived from 3-hydroxy-1-adamantyl (meth)acrylate, a structural unit derived from 3,5-dihydroxy-1-adamantyl (meth)acrylate, a structural unit derived from (meth)acryloyloxy-γ-butyrolactone having a lactone ring optionally substituted by alkyl, a structural unit of the formula (Ia) and a structural unit of the formula

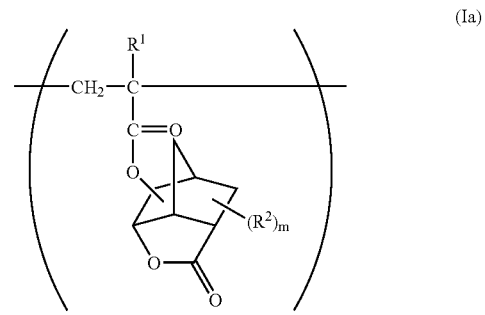

(Ia)

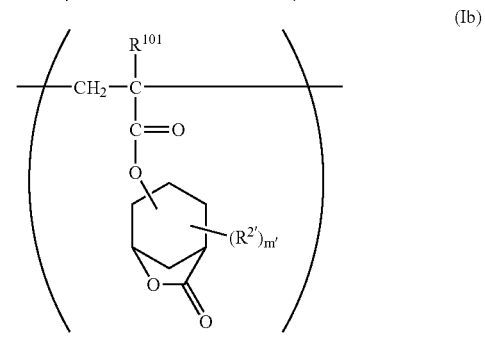

(Ib)

and (2) a structural unit of the formula (II)

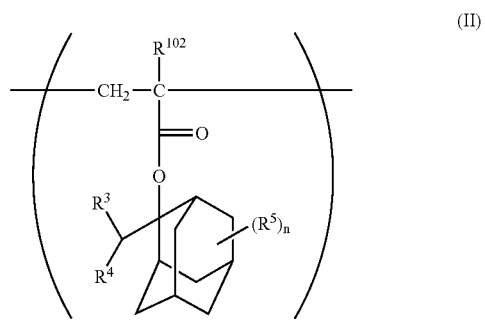

(II)

and which itself is insoluble or poorly soluble in an alkali aqueous solution but becomes soluble in an alkali aqueous solution by the action of an acid; and also provides a chemical amplification type positive resist composition comprising a resin defined above and an acid generator.

8 Claims, No Drawings

CHEMICAL AMPLIFICATION TYPE POSITIVE RESIST COMPOSITION AND A RESIN THEREFOR

This nonprovisional application claims priority under 35 U.S.C. § 119(a) on Patent Application No. 2003-345471 filed in JAPAN on Oct. 3, 2003, the entire contents of which are hereby incorporated by reference.

BACKGROUND OF THE INVENTION

1. Field of the Invention

The present invention relates to a chemical amplification type positive resist composition used in fine processing of semiconductors and also provides a novel resin useful for the resist composition.

2. Related Art

Semiconductor microfabrication employs a lithography process using a resist composition. In lithography, theoretically, the shorter the exposure wavelength becomes, the higher the resolution can be made, as expressed by Rayleigh's diffraction limit formula. The wavelength of an exposure light source for lithography used in the manufacture of semiconductor devices has been shortened year by year as g line having a wavelength of 436 nm, i line having a wavelength of 365 nm, KrF excimer laser having a wavelength of 248 nm and ArF excimer laser having a wavelength of 193 nm. $F_2$ excimer laser having a wavelength of 157 nm seems to be promising as the next-generation exposure light source. Further, as the exposure light source of the subsequent generation, soft X ray (EUV) having a wavelength of 13 nm or shorter has been proposed as the exposure light source following the 157 nm-wavelength $F_2$ excimer laser.

Since light sources having shorter wavelength than that of g line and i line, such as excimer laser and the like have low illumination, it is necessary to enhance the sensitivity of a resist. Consequently, there are used so-called chemical amplification type resists utilizing the catalytic action of an acid produced from a sulfonium salt and the like by exposure and containing a resin having a group being dissociated by this acid (JP2000-137327 A).

For further reduction of exposure time, chemical amplification type resist composition is required to have higher sensitivity than conventionally known compositions.

SUMMARY OF THE INVENTION

An object of the present invention is to provide a novel resin and to provide a chemical amplification type resist composition comprising the above-mentioned resin and an acid generator, and suitable for excimer laser lithography using ArF, KrF and the like, showing excellent various resist abilities, and giving particularly improved sensitivity.

The present invention relates to the followings:

<1> A resin which comprises (1) at least one structural unit selected from the group consisting of a structural unit derived from 3-hydroxy-1-adamantyl (meth)acrylate, a structural unit derived from 3,5-dihydroxy-1-adamantyl (meth)acrylate, a structural unit derived from (meth) acryloyloxy-γ-butyrolactone having a lactone ring optionally substituted by alkyl, a structural unit of the formula (Ia) and a structural unit of the formula (Ib)

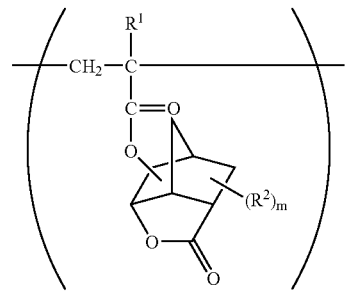

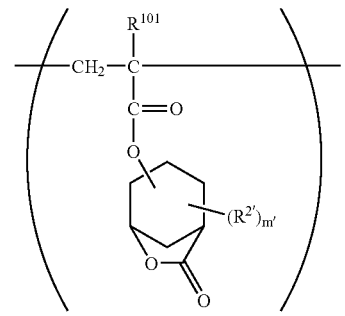

wherein $R^1$ and $R^{101}$ each independently represent hydrogen or methyl, $R^2$ and $R^{2'}$ each independently represent methyl or ethyl, m and m' each independently represent an integer of 0 to 3, and when m is 2 or 3, each of $R^2$ is same or different, and when m' is 2 or 3, each of $R^{2'}$ is same or different, and (2) a structural unit of the formula (II)

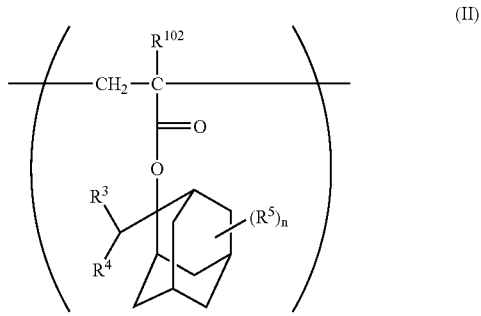

wherein $R^{102}$ represents hydrogen or methyl, $R^3$ and $R^4$ each independently represent methyl or ethyl, $R^5$ represents methyl, halogen or hydroxyl, n represents an integer of 0 to 14, and when n is 2 or more, each of $R^5$ is same or different, and which itself is insoluble or poorly soluble in an alkali aqueous solution but becomes soluble in an alkali aqueous solution by the action of an acid.

<2> The resin according to <1> wherein the content of the structural unit of the formula (II) in all structural units of the resin is from 10 to 80% by mol.

<3> The resin according to <1> or <2> wherein the resin further contains a structural unit derived from 2-norbornene and a structural unit derived from an aliphatic unsaturated dicarboxylic anhydride.

<4> The resin according to any of <1> to <3> wherein the resin further contains a structural unit of the formula (III)

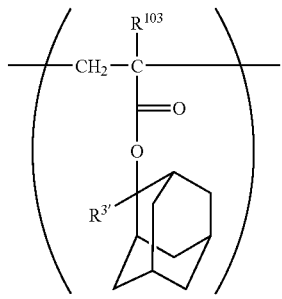

(III)

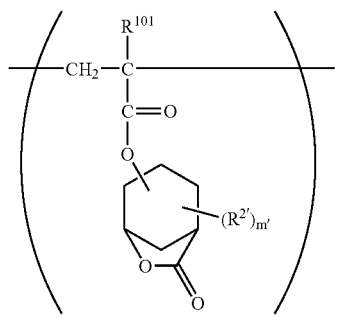

(Ib)

wherein $R^{103}$ represents hydrogen or methyl and $R^{3'}$ represents methyl or ethyl.

<5> The resin according to any of <1> to <4> wherein the resin further contains a structural unit of the formula (IV)

wherein $R^1$ and $R^{101}$ each independently represent hydrogen or methyl, $R^2$ and $R^{2'}$ each independently represent methyl or ethyl, m and m' each independently represent an integer of 0 to 3, and when m is 2 or 3, each of $R^2$ is same or different, and when m' is 2 or 3, each of $R^{2'}$ is same or different, and (2) a structural unit of the formula (II)

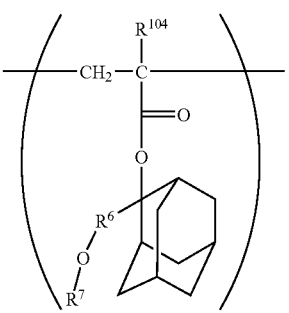

(IV)

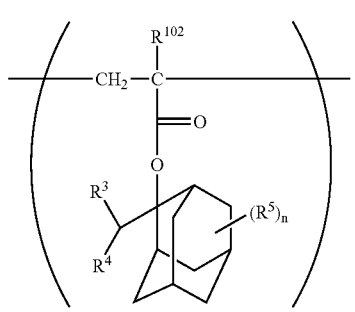

(II)

wherein $R^{104}$ represents hydrogen or methyl, and $R^6$ and $R^7$ each independently represent alkyl having 1 to 4 carbon atoms.

<6> A chemical amplification type positive resist composition comprising (A) a resin which comprises (1) at least one structural unit selected from the group consisting of a structural unit derived from 3-hydroxy-1-adamantyl (meth)acrylate, a structural unit derived from 3,5-dihydroxy-1-adamantyl (meth)acrylate, a structural unit derived from (meth)acryloyloxy-γ-butyrolactone having a lactone ring optionally substituted by alkyl, a structural unit of the formula (Ia) and a structural unit of the following formula (Ib)

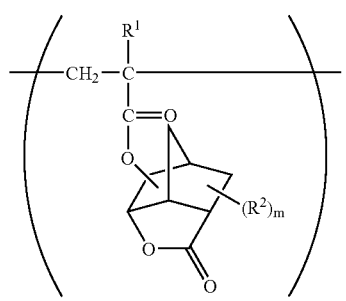

(Ia)

wherein $R^{102}$ represents hydrogen or methyl, $R^3$ and $R^4$ each independently represent methyl or ethyl, $R^5$ represents methyl, halogen or hydroxyl, n represents an integer of 0 to 14, and when n is 2 or more, each of $R^5$ is same or different, and which itself is insoluble or poorly soluble in an alkali aqueous solution but becomes soluble in an alkali aqueous solution by the action of an acid, and (B) an acid generator.

<7> The composition according to <6> wherein the content of the structural unit of the formula (II) in all structural units of the resin is from 10 to 80% by mol.

<8> The resin according to <6> or <7> wherein the resin further contains a structural unit derived from 2-norbornene and a structural unit derived from an aliphatic unsaturated dicarboxylic anhydride.

<9> The resin according to any of <6> to <8> wherein the resin further contains a structural unit of the formula (III)

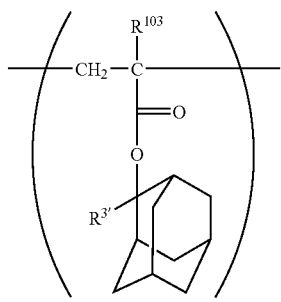

(III)

wherein R$^{103}$ represents hydrogen or methyl and R$^{3'}$ represents methyl or ethyl.

<10> The resin according to any of <6> to <9> wherein the resin further contains a structural unit of the formula (IV)

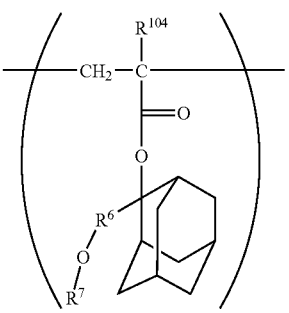

(IV)

wherein R$^{104}$ represents hydrogen or methyl and R$^6$ and R$^7$ each independently represent alkyl having 1 to 4 carbon atoms.

<11> The composition according to any of <6> to <10> wherein the acid generator is the one selected from the group consisting of a sulfonium salt of the formula (Va)

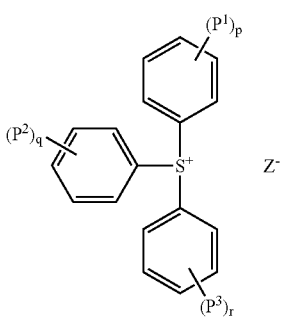

(Va)

wherein P$^1$ to P$^3$ each independently represent hydroxyl, alkyl having 1 to 6 carbon atoms or alkoxy having 1 to 6 carbon atoms, p, q and r each independently represent an integer of 0 to 3, when p is 2 or more, each of P$^1$ is same or different, when q is 2 or more, each of P$^2$ is same or different when r is 2 or more, each of P$^3$ is same or different, and Z$^-$ represents counter ion, an iodonium salt of the formula (Vb)

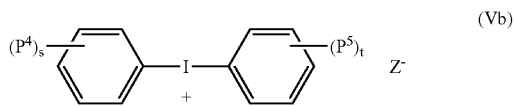

(Vb)

wherein P$^4$ and P$^5$ each independently represent hydroxyl, alkyl having 1 to 6 carbon atoms or alkoxy having 1 to 6 carbon atoms, s and t each independently represent 0 or 1, and Z$^-$ has the same meaning as defined above, and a sulfonium salt of the formula (Vc)

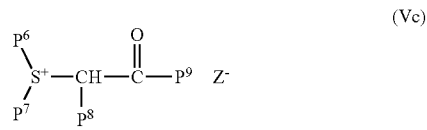

(Vc)

wherein P$^6$ and P$^7$ each independently represent alkyl having 1 to 6 carbon atoms or cycloalkyl having 3 to 10 carbon atoms, or P$^6$ and P$^7$ bond to form divalent acyclic hydrocarbon having 3 to 7 carbon atoms which forms a ring together with the adjacent S$^+$, and at least one —CH$_2$— in the divalent acyclic hydrocarbon may be substituted by —CO—, —O— or —S—, P$^8$ represents hydrogen, P$^9$ represents alkyl having 1 to 6 carbon atoms, cycloalkyl having 3 to 10 carbon atoms or aromatic ring group optionally substituted, or P$^8$ and P$^9$ bond to form 2-oxocycloalkyl together with the adjacent —CHCO—, and Z$^-$ has the same meaning as defined above.

<12> The composition according to <11> wherein Z$^-$ is an anion of the formula (VI)

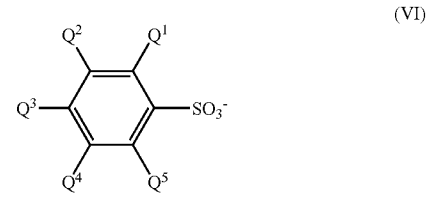

(VI)

wherein Q$^1$, Q$^2$, Q$^3$, Q$^4$ and Q$^5$ each independently represent hydrogen, alkyl having 1 to 16 carbon atoms, alkoxy having 1 to 16 carbon atoms, halogen, haloalkyl having 1 to 8 carbon atoms, aryl having 6 to 12 carbon atoms, aralkyl having 7 to 12 carbon atoms, cyano, alkylthio having 1 to 4 carbon atoms, alkylsulfonyl having 1 to 4 carbon atoms, hydroxyl, nitro or a group of the formula (VI')

—COO—X-Cy$^1$     (VI')

wherein X represents alkylene and at least one —CH$_2$— in the alkylene may be substituted by —O— or —S—, Cy$^1$ represents alicyclic hydrocarbon having 3 to 20 carbon atoms, with the proviso that at least one of Q$^1$, Q$^2$, Q$^3$, Q$^4$ and Q$^5$ is a group of the formula (VI').

<13> The composition according to <11> wherein $Z^-$ is an anion of the formula (VIIa)

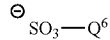
(VIIa)

wherein $Q^6$ represents perfluoroalkyl having 1 to 20 carbon atoms, optionally substituted naphtyl having 10 to 20 carbon atoms or optionally substituted anthryl having 10 to 20 carbon atoms, or an anion of the formula (VIIb)

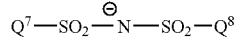
(VIIb)

wherein $Q^7$ and $Q^8$ each represent perfluoroalkyl having 1 to 20 carbon atoms or optionally substituted aromatic group having 6 to 20 carbon atoms.

<14> The composition according to any of <6> to <13> wherein the content of the resin is 80 to 99.9% by weight and the content of the acid generator is 0.1 to 20% by weight based on the total amount of the resin and the acid generator.

<15> The composition according to <6> to <14> wherein the composition further comprises basic nitrogen-containing organic compound as a quencher.

<16> The composition according to <15> wherein the content of the basic nitrogen-containing organic compound is 0.001 to 1 part by weight per 100 parts by weight of the resin.

DESCRIPTION OF PREFERRED EMBODIMENTS

The present resin comprises (1) at least one structural unit selected from the group consisting of a structural unit derived from 3-hydroxy-1-adamantyl (meth)acrylate, a structural unit derived from 3,5-dihydroxy-1-adamantyl (meth)acrylate, a structural unit derived from (meth)acryloyloxy-γ-butyrolactone having a lactone ring optionally substituted by alkyl, a structural unit of the formula (Ia) and a structural unit of the formula (Ib)

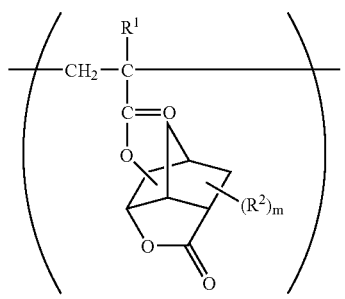
(Ia)

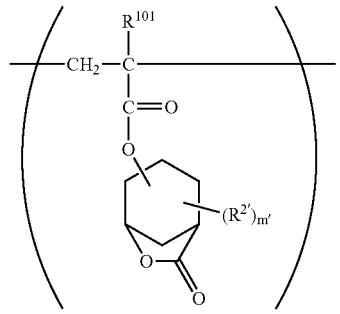
(Ib)

wherein $R^1$ and $R^{101}$ each independently represent hydrogen or methyl, $R^2$ and $R^{2'}$ each independently represent methyl or ethyl, m and m' each independently represent an integer of 0 to 3, and when m is 2 or 3, each of $R^2$ is same or different, and when m' is 2 or 3, each of $R^{2'}$ is same or different, and (2) a structural unit of the formula (II)

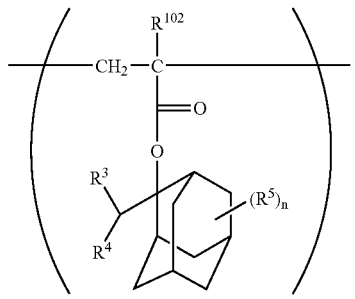
(II)

wherein $R^{102}$ represents hydrogen or methyl, $R^3$ and $R^4$ each independently represent methyl or ethyl, $R^5$ represents methyl, halogen or hydroxyl, n represents an integer of 0 to 14, and when n is 2 or more, each of $R^5$ is same or different, and the resin itself is insoluble or poorly soluble in an alkali aqueous solution but becomes soluble in an alkali aqueous solution by the action of an acid. Hereinafter the present resin may be referred to as "Resin Component".

The present composition comprises Resin Component and an acid generator and can preferably be used for a chemical amplification type positive resist composition.

In the present specification, "at least one structural unit selected from the group consisting of a structural unit derived from 3-hydroxy-1-adamantyl (meth)acrylate, a structural unit derived from 3,5-dihydroxy-1-adamantyl (meth)acrylate, a structural unit derived from (meth)acryloyloxy-γ-butyrolactone having a lactone ring optionally substituted by alkyl, a structural unit of the formula (Ia) and a structural unit of the following formula (Ib)" may be referred to as "Structure Unit (1)".

Resin Component can be produced by polymerizing (1) at least one monomer selected from the group consisting of 3-hydroxy-1-adamantyl (meth)acrylate, 3,5-dihydroxy-1-adamantyl (meth)acrylate, (meth)acryloyloxy-γ-butyrolactone having a lactone ring optionally substituted by alkyl, a compound of the formula (Ia') and a compound of the formula (Ib')

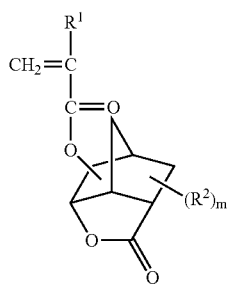

(Ia')

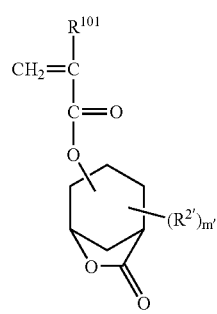

(Ib')

wherein $R^1$, $R^{101}$, $R^2$, $R^{2'}$, m and m' have the same meanings as defined above, and
(2) a compound of the formula (II')

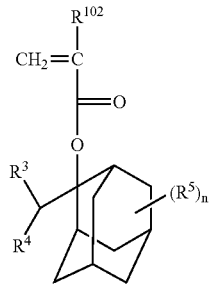

(II')

wherein $R^{102}$, $R^3$, $R^4$ and $R^5$ have the same meanings as defined above.

3-Hydroxy-1-adamantyl (meth)acrylate and 3,5-dihydroxy-1-adamantyl (meth)acrylate can be produced, for example, by reacting corresponding hydroxyadamantane with (meth)acrylic acid or its acid halide, and they are also commercially available.

(Meth)acryloyloxy-γ-butyrolactone can be produced by reacting α- or β-bromo-γ-butyrolactone having a lactone ring optionally substituted by alkyl with acrylic acid or methacrylic acid, or reacting α- or β-hydroxy-γ-butyrolactone having a lactone ring optionally substituted by alkyl with acrylic halide or methacrylic halide.

As monomers to lead to structural units of the formulae (Ia) and (Ib), the compounds of the formulae (Ia') and (Ib'), specifically listed are, for example, (meth)acrylates of alicyclic lactones having hydroxyl described below, and mixtures thereof, and the like. These esters can be produced, for example, by reacting corresponding alicyclic lactone having hydroxyl with (meth)acrylic acids, and the production method thereof is described in, for example,

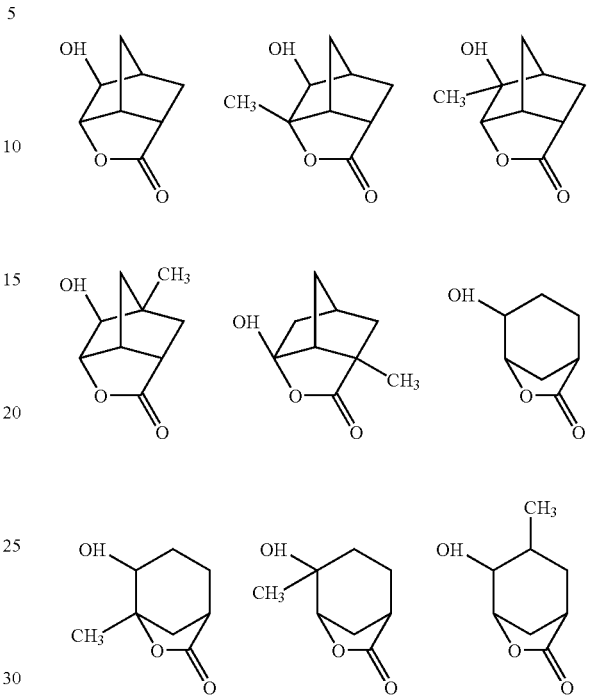

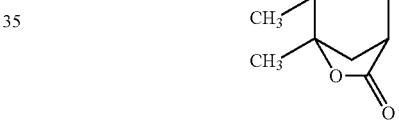

When any of the structural unit derived from 3-hydroxy-1-adamantyl (meth)acrylate, the structural unit derived from 3,5-dihydroxy-1-adamantyl (meth)acrylate, the structural unit derived from α-(meth)acryloyloxy-γ-butyrolactone, the structural unit derived from β-(meth)acryloyloxy-γ-butyrolactone and the structural unit of the formulae (Ia) and (Ib) is contained in Resin Component, not only the adhesiveness of the resist to a substrate is improved, but also the resolution of the resist is improved.

Here, examples of the (meth)acryloyloxy-γ-butyrolactone include α-acryloyloxy-γ-butyrolactone, α-methacryloyloxy-γ-butyrolactone, α-acryloyloxy-β,β-dimethyl-γ-butyrolactone, α-methacryloyloxy-β,β-dimethyl-γ-butyrolactone, α-acryloyloxy-α-methyl-γ-butyrolactone, α-methacryloyloxy-α-methyl-γ-butyrolactone, β-acryloyloxy-γ-butyrolactone, β-methacryloyloxy-γ-butyrolactone, β-methacryloyloxy-α-methyl-γ-butyrolactone and the like.

In the formula (II) or the formula (II'), $R^{102}$ represents hydrogen or methyl. $R^3$ and $R^4$ each independently represent methyl or ethyl. $R^5$ represents methyl, halogen or hydroxyl. Examples of the halogen include fluorine, chlorine, bromine, iodine, and the like.

Examples of the compound of the formula (II') include the followings:

-continued
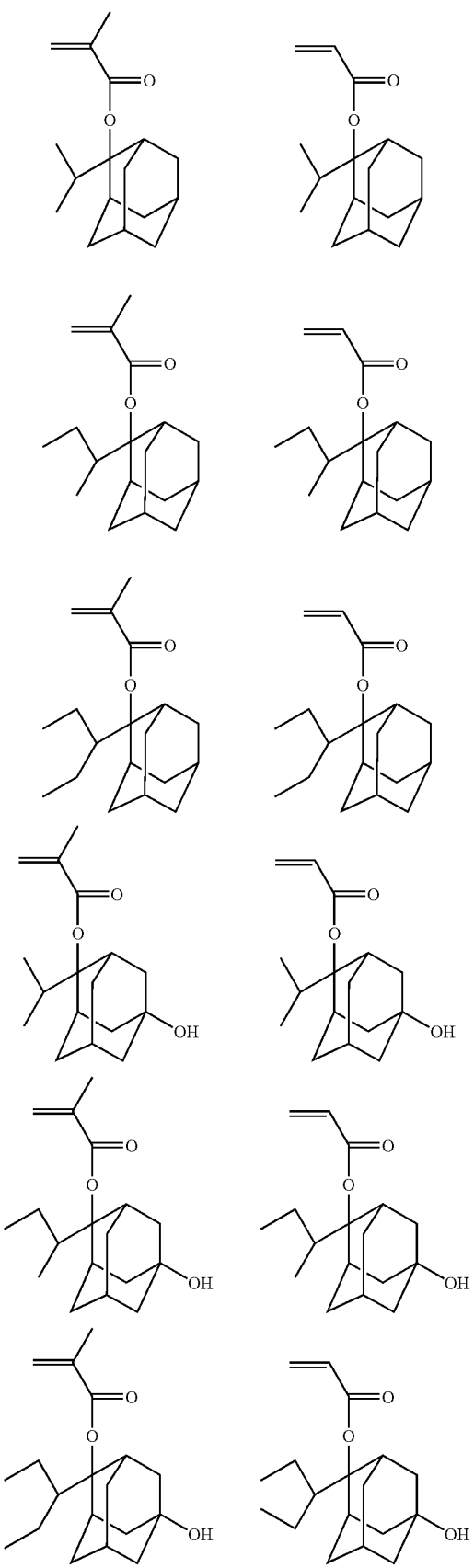
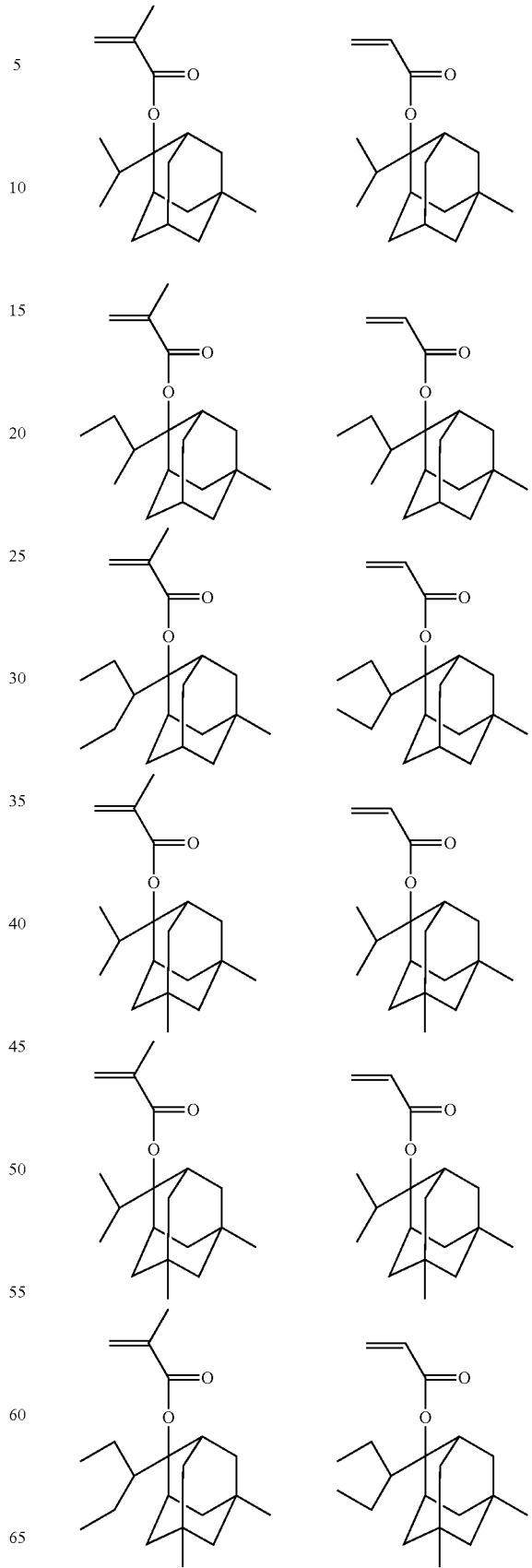

-continued

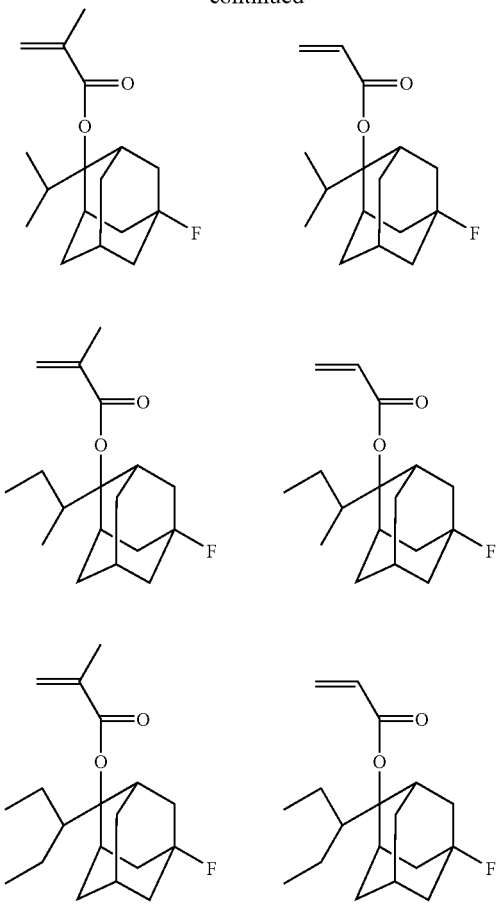

Examples of methods for producing Resin Component include radical polymerization method, anion polymerization method, coordination polymerization method, and the like, and radical polymerization method is preferred.

As polymerization initiators used therein, the ones effectively generating radicals by heating are preferred. Examples thereof include azo compounds such as 2,2'-azobisisobutyronitrile, dimethyl 2,2'-azobisisobutylate, 2,2'-azobis(2,4-dimethylvaleronitrile), 2,2'-azobis(2-methylbutyronitrile), and the like; organic peroxides such as 2,5-dimethyl-2,5-bis(tert-butylperoxy)hexane, tert-butyl peroxypivalate, and the like. Each of the polymerization initiator can be used alone or in combination with at least one other kind.

Chain transfer agents such as 1-butanethiol, 2-butanethiol, 1-octanethiol, 1-decanethiol, 1-tetradecanethiol, cyclohexanethiol, 2-methyl-1-propanethiol, and the like, can be used together.

Preferred organic solvents used for the production of Resin Component are the ones capable of dissolving all of monomers, polymerization initiators and copolymer obtained. Examples thereof include hydrocarbons such as toluene, and the like, 1,4-dioxane, tetrahydrofuran, methyl isobutyl ketone, isopropyl alcohol, γ-butyrolactone, propylene glycol monomethyl acetate, ethyl lactate, and the like. Each of the solvent can be used alone or in combination with at least one other kind.

The polymerization temperature is usually 0 to 150° C., preferably 40 to 100° C.

Resin Component may be a copolymer further comprising a structural unit of the formula (III) in addition to Structure Unit (1) and the structural unit of the formula (II):

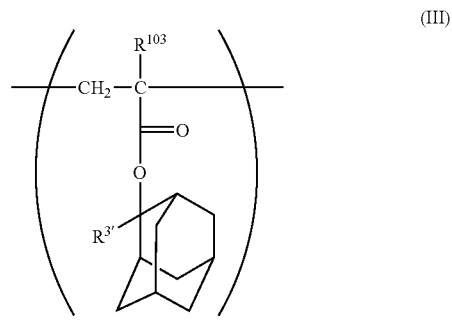

wherein $R^{103}$ represents hydrogen or methyl and $R^{3'}$ represents methyl or ethyl.

Monomer thereof is represented by the formula

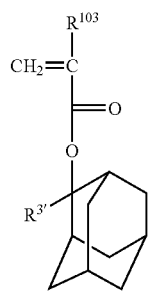

wherein $R^{103}$ and $R^{3'}$ have the same meanings as defined above.

Examples of the monomers include the followings:

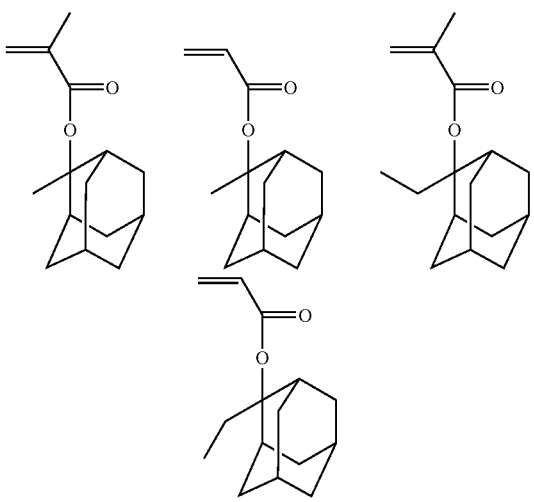

Resin Component may be a copolymer further comprising a structural unit of the formula (IV):

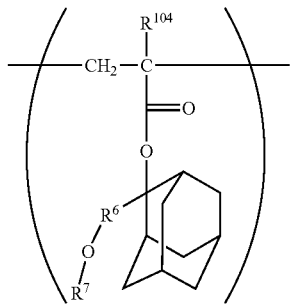

(IV)

wherein $R^{104}$ represents hydrogen or methyl, and $R^6$ represents alkylene having 1 to 4 carbon atoms, and $R^7$ represents alkyl having 1 to 4 carbon atoms.

Monomer thereof is represented by the formula

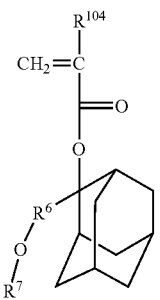

wherein $R^{104}$, $R^6$ and $R^7$ have the same meanings as defined above.

Examples of the alkylene having 1 to 4 carbon atoms in $R^6$ include methylene, ethylene, propylene, butylene, 1-methylethylene, 2-methylethylene, 1,2-dimethylethylene, 1-ethylethylene, 2-ethylethylene, 1-methylpropylene, 2-methylpropylene, 3-methylpropylene, ethylidene, propylidene, butylidene, and the like. Examples the alkyl having 1 to 4 carbon atoms in $R^7$ include methyl, ethyl, propyl, isopropyl, butyl, isobutyl, sec-butyl, tert-butyl, and the like.

Specific examples of the monomers include the followings:

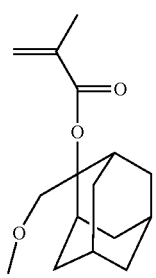
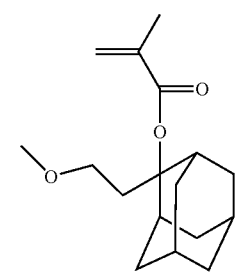
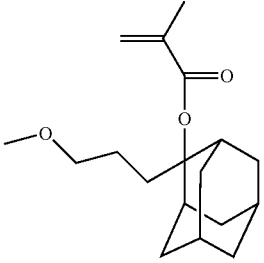
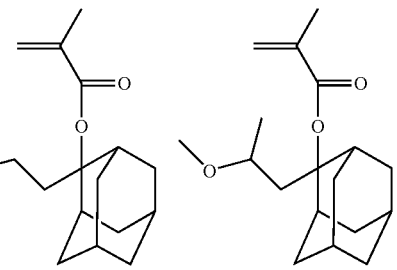
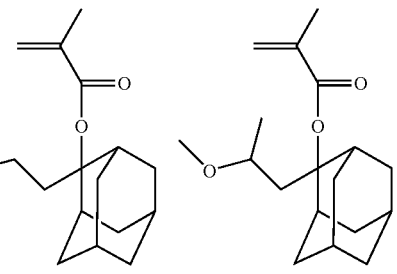
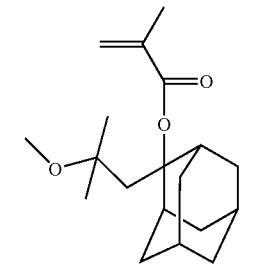
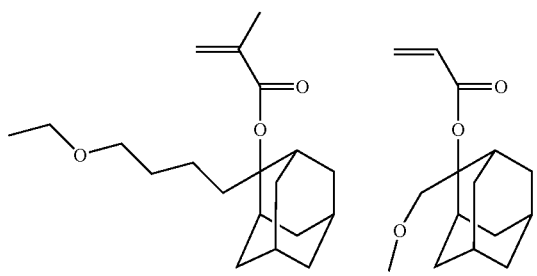
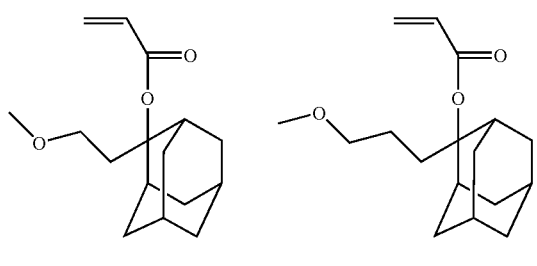
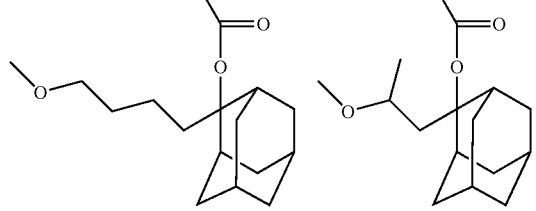
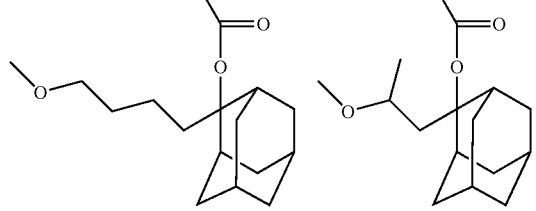

-continued

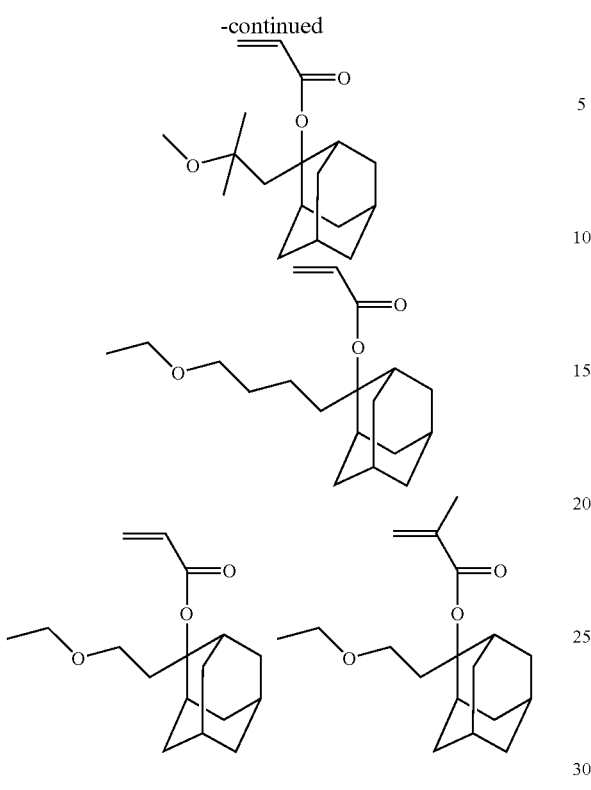

Resin Component may be a copolymer further comprising other structural unit having acid-labile group derived from other known (meth)acrylate(s) in addition to Structure Unit (1) and the structural unit of the formula (II).

Such acid-labile group may be selected from the various groups known as a protective group which itself has ability to suppress dissolution of resin in alkali aqueous solution.

Specific examples of such group include alkoxycarbonyl groups such as methoxycarbonyl, tert-butoxycarbonyl, and the like; an acetal type oxycarbonyl group such as methoxymethoxycarbonyl, ethoxymethoxycarbonyl, 1-ethoxylethoxycarbonyl, 1-isobutoxyethoxycarbonyl, 1-isopropoxyethoxycarbonyl, 1-ethoxypropoxycarbonyl, 1-(2-methoxyethoxy)ethoxycarbonyl, 1-(2-acetoxyethoxy)ethoxycarbonyl, 1-[2-(1-adamantyloxy)ethoxy]ethoxycarbonyl, 1-[2-(adamantanecarbonyloxy)ethoxy]ethoxylcarbonyl, 1-[2-(1-adamantanecarbonyloxyl)ethoxy]ethoxycarbonyl, tetrahydro-2-furyloxycarbonyl, tetrahydro-2-pyranyloxycarbonyl, and the like; alicyclic oxycarbonyl groups such as isobornyloxycarbonyl, 1-(1-adamantyl)-1-alkylalkyloxycarbonyl, and the like.

Resin Component can also contain, other structural units not dissociated or not easily dissociated by the action of an acid. Examples of such other structural units which can be contained include structural units derived from monomers having a free carboxyl group such as acrylic acid and methacrylic acid, structural units derived from aliphatic unsaturated dicarboxylic anhydrides such as maleic anhydride and itaconic anhydride, structural unit derived from 2-norbornene, structural unit derived from (meth)acrylonitrile, structural unit derived from other (meth)acrylates, and the like.

In the case of KrF exposure, there is no problem on light absorption, and a structural unit derived from hydroxystyrene can be further contained.

Resin Component containing a structural unit derived from 2-norbornene shows strong structure because of alicyclic group directly present on its main chain and shows a property that dry etching resistance is excellent. The structural unit derived from 2-norbornene can be introduced into the main chain by radical polymerization using, for example, in addition to corresponding 2-norbornene, aliphatic unsaturated dicarboxylic anhydrides such as maleic anhydride and itaconic anhydride together. The structural unit derived from 2-norbornene is formed by opening of its double bond, and can be represented by the formula (VIII). The structural unit derived from maleic anhydride and the structural unit derived from itaconic anhydride which are the structural unit derived from aliphatic unsaturated dicarboxylic anhydrides are formed by opening of their double bonds, and can be represented by the formula (IX) and the formula (X), respectively.

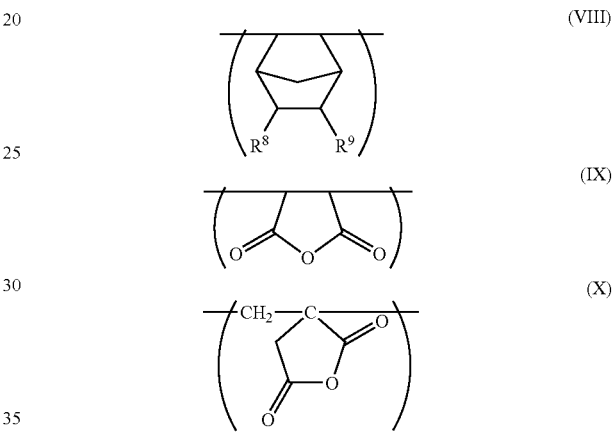

Here, $R^8$ and $R^9$ in the formula (VIII) each independently represent hydrogen, alkyl having 1 to 3 carbon atoms, hydroxyalkyl having 1 to 3 carbon atoms, carboxyl, cyano or —COOZa group in which Za represents alcohol residue, or $R^8$ and $R^9$ can bond together to form a carboxylic anhydride residue represented by —C(=O)OC(=O)—.

In $R^8$ and $R^9$, examples of the alkyl include methyl, ethyl, propyl and isopropyl, specific examples of hydroxyalkyl include hydroxymethyl, 2-hydroxyethyl and the like.

In $R^8$ and $R^9$, —COOZa group is an ester formed from carboxyl, and as the alcohol residue corresponding to Za, for example, optionally substituted alkyls having about 1 to 8 carbon atoms, 2-oxooxolan-3- or -4-yl and the like are listed, and as the substituent on the alkyl, hydroxyl, alicyclic hydrocarbon residues and the like are listed.

Specific examples of —COOZa include methoxycarbonyl, ethoxycarbonyl, 2-hydroxyethoxycarbonyl, tert-butoxycarbonyl, 2-oxooxalan-3-yloxycarbonyl, 2-oxooxalan-4-yloxycarbonyl, 1,1,2-trimethylpropoxycarbonyl, 1-cyclohexyl-1-methylethoxycarbonyl, 1-(4-methylcyclohexyl)-1-methylethoxycarbonyl, 1-(1-adamantyl)-1-methylethoxycarbonyl and the like.

Specific examples of the monomer used to derive the structural unit represented by the formula (VIII) may include the followings;

2-norbornene,
2-hydroxy-5-norbornene,
5-norbornen-2-carboxylic acid,
methyl 5-norbornen-2-carboxylate,
tert-butyl 5-norbornen-2-carboxylate, 1-cyclohexyl-1-methylethyl 5-norbornen-2-carboxylate,
1-(4-methylcyclohexyl)-1-methylethyl 5-norbornen-2-carboxylate,
1-(4-hydroxycyclohexyl)-1-methylethyl 5-norbornen-2-carboxylate,
1-methyl-1-(4-oxocyclohexyl)ethyl 5-norbornen-2-carboxylate,
1-(1-adamantyl)-1-methylethyl 5-norbornen-2-carboxylate,
1-methylcyclohexyl 5-norbornen-2-carboxylate,
2-methyl-2-adamantyl 5-norbornen-2-carboxylate,
2-ethyl-2-adamantyl 5-norbornen-2-carboxylate,
2-hydroxyethyl 5-norbornen-2-carboxylate,
5-norbornen-2-methanol,
5-norbornen-2,3-dicarboxylic acid anhydride, and the like.

Weight average molar weight of Resin Component is preferably 1000 to 100000, especially preferably 5000 to 20000.

Resin Component preferably contains the structural unit of the formula (II) and Structure Unit (1) in a ratio of 10 to 80% by mol and 20 to 90% by mol, preferably 15 to 80% by mol and 20 to 80% by mol in all structural units of Resin Component though the ratio varies depending on the kind of radiation for patterning exposure, the kind of an acid-labile group, and the like.

When structural unit(s) having an acid-labile group and other structural units not easily dissociated by the action of an acid, for example, a structural unit of the formula (III), a structural unit of the formula (IV), a structural unit derived from hydroxystyrene, a structural unit of the formula (VIII), a structural unit derived from maleic anhydride of the formula (IX) which is a structural unit derived from an aliphatic unsaturated dicarboxylic anhydride, a structural unit derived from itaconic anhydride of the formula (X) and the like are contained, it is preferable that the sum of these structural units is in the range of 2 to 70% by mol based on all structural units of the resin.

When 2-norbornenes and aliphatic unsaturated dicarboxylic anhydride are used as copolymerization monomer, it is preferable to use them in excess amount in view of a tendency that these are not easily polymerized.

The acid generator, another component of the positive resist composition, is that which is decomposed to generate an acid by allowing radioactive ray such as light and electron beam to act on the acid generator itself or a resist composition containing the acid generator. The acid generated from the acid generator acts on Resin Component, to dissociate acid-labile group present in Resin Component.

Examples of the acid generator in the present resist composition include a sulfonium salt of the formula (Va)

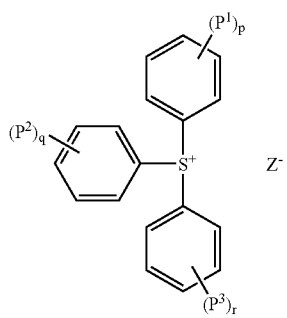

wherein $P^1$ to $P^3$ each independently represent hydroxyl, alkyl having 1 to 6 carbon atoms or alkoxy having 1 to 6 carbon atoms, p, q and r each independently represent an integer of 0 to 3, when p is 2 or more, each of $P^1$ is same or different, when q is 2 or more, each of $P^2$ is same or different, when r is 2 or more, each of $P^3$ is same or different, and $Z^-$ represents counter ion;

an iodonium salt of the formula (Vb)

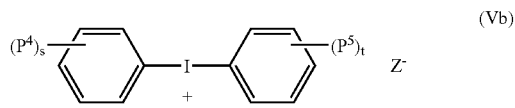

wherein $P^4$ and $P^5$ each independently represent hydroxyl, alkyl having 1 to 6 carbon atoms or alkoxy having 1 to 6 carbon atoms, s and t each independently represent 0 or 1, and $Z^-$ has the same meaning as defined above; or a sulfonium salt of the formula (Vc)

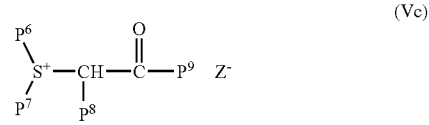

wherein $P^6$ and $P^7$ each independently represent alkyl having 1 to 6 carbon atoms or cycloalkyl having 3 to 10 carbon atoms, or $P^6$ and $P^7$ bond to form divalent acyclic hydrocarbon having 3 to 7 carbon atoms which forms a ring together with the adjacent $S^+$, and at least one —$CH_2$— in the divalent acyclic hydrocarbon may be substituted by —CO—, —O— or —S—, $P^8$ represents hydrogen, $P^9$ represents alkyl having 1 to 6 carbon atoms, cycloalkyl having 3 to 10 carbon atoms or aromatic ring group optionally substituted, or $P^8$ and $P^9$ bond to form 2-oxocycloalkyl together with the adjacent —CHCO—, and $Z^-$ has the same meaning as defined above.

In $P^1$, $P^2$, $P^3$, $P^4$ and $P^5$, specific examples of the alkyl include methyl, ethyl, propyl, isopropyl, butyl, tert-butyl, pentyl, hexyl and the like, and examples of the alkoxy include methoxy, ethoxy, propoxy, isopropoxy, butoxy, tert-butoxy and the like.

In $P^6$, $P^7$ and $P^9$, specific examples of the alkyl include methyl, ethyl, propyl, isopropyl, butyl, tert-butyl, pentyl, hexyl and the like, and specific examples of the cycloalkyl include cyclopropyl, cyclobutyl, cyclopentyl, cyclohexyl, cycloheptyl and the like. Specific examples of the ring group formed by adjacent $S^+$ and divalent acyclic hydrocarbon by $P^6$ and $P^7$ include pentamethylenesulfonio group, tetramethylenesulfonio group, oxybisethylenesulfonio group, and the like. In $P^9$, specific examples of the aromatic ring group include phenyl, tolyl, xylyl, naphtyl and the like. Specific examples of the 2-oxocycloalkyl formed by bonding $P^8$ and $P^9$ together with the adjacent —CHCO— include 2-oxocyclohexyl, 2-oxocyclopentyl and the like.

Specific examples of cations of in the formulas (Va), (Vb) or (Vc) include the followings:

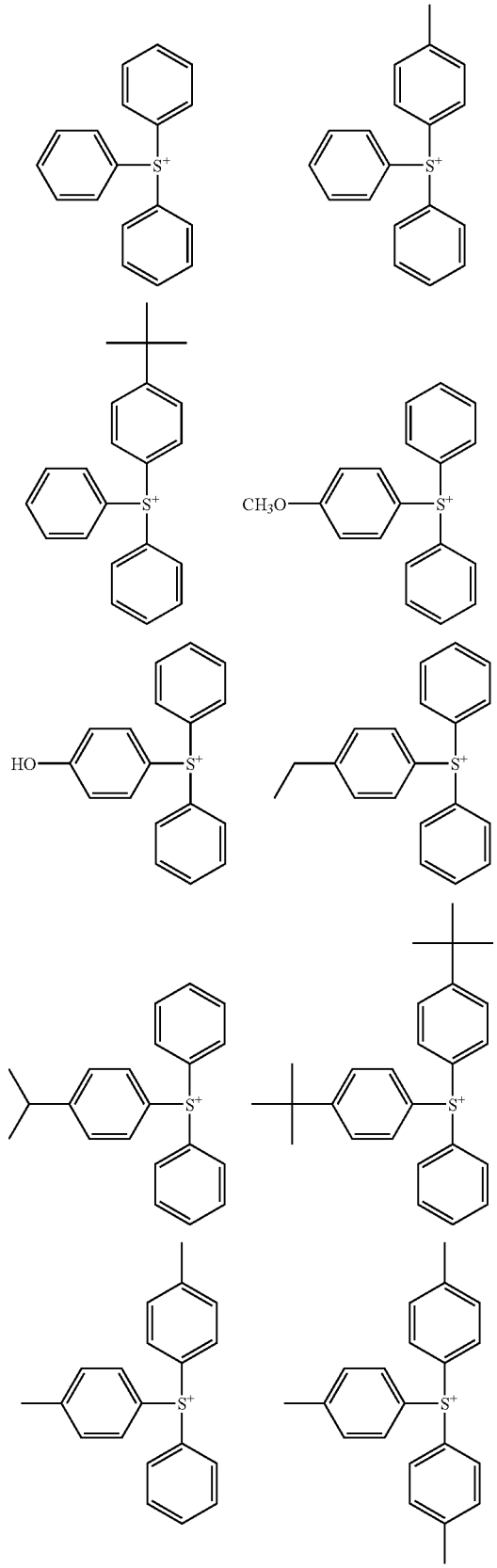
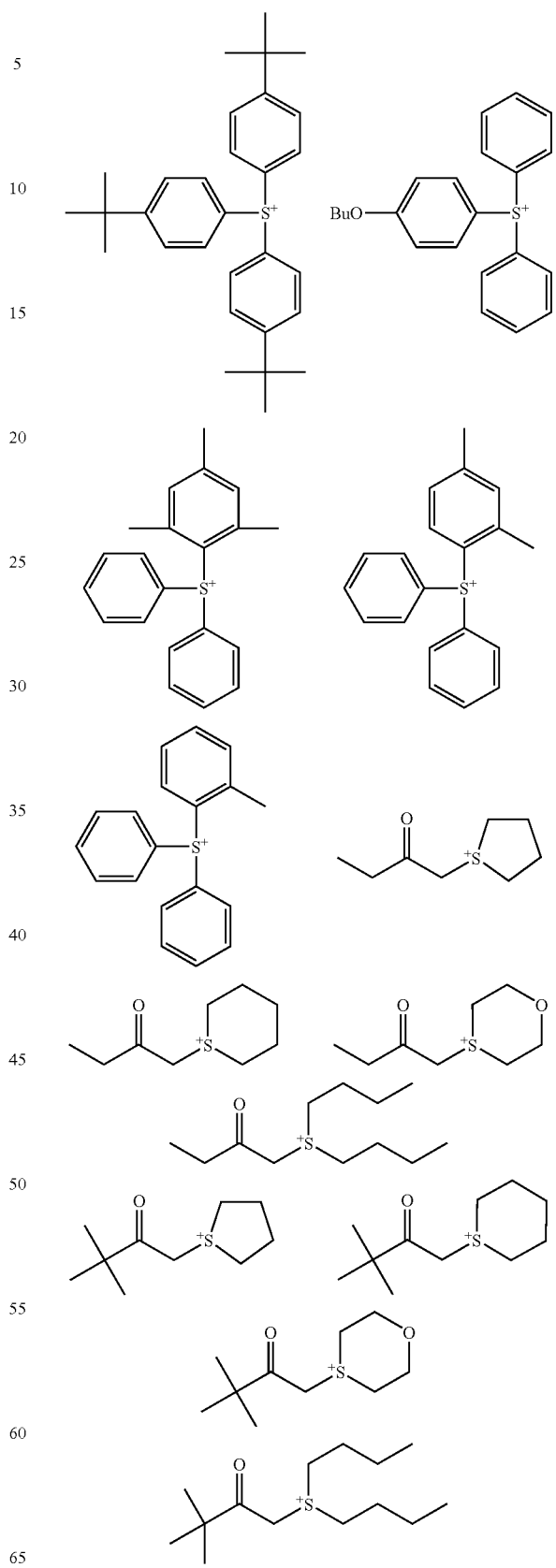

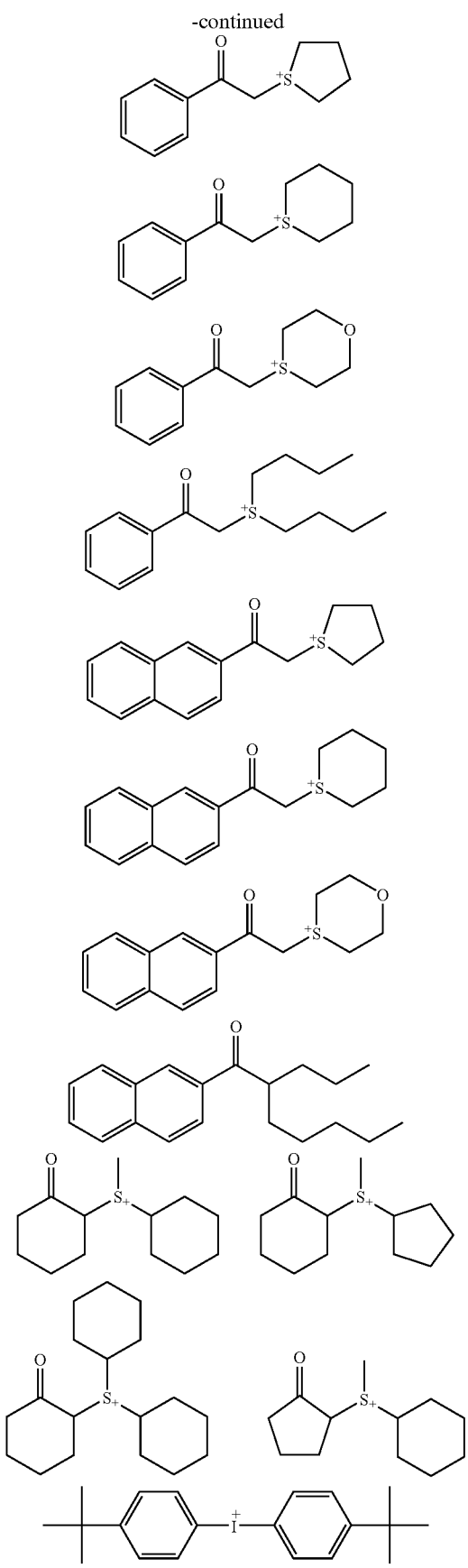

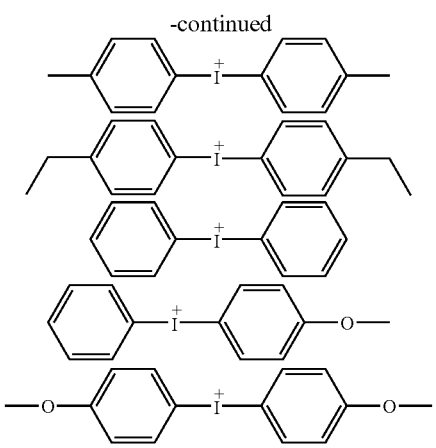

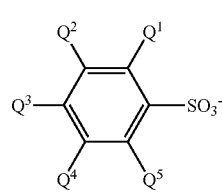

$Z^-$ represents a counter anion. Examples of the counter anions include an anion of the formula (VI)

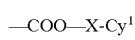

(VI)

wherein $Q^1$, $Q^2$, $Q^3$, $Q^4$ and $Q^5$ each independently represent hydrogen, alkyl having 1 to 16 carbon atoms, alkoxy having 1 to 16 carbon atoms, halogen, haloalkyl having 1 to 8 carbon atoms, aryl having 6 to 12 carbon atoms, aralkyl having 7 to 12 carbon atoms, cyano, alkylthio having 1 to 4 carbon atoms, alkylsulfonyl having 1 to 4 carbon atoms, hydroxyl, nitro or a group of the formula (VI')

—COO—X-$Cy^1$           (VI')

wherein X represents alkylene and at least one —$CH_2$— in the alkylene may be substituted by —O— or —S—, $Cy^1$ represents alicyclic hydrocarbon having 3 to 20 carbon atoms, with the proviso that at least one of $Q^1$, $Q^2$, $Q^3$, $Q^4$ and $Q^5$ is a group of the formula (VI').

Examples of the alkyl having 1 to 16 carbon atoms include methyl, ethyl, propyl, isopropyl, butyl, tert-butyl, pentyl, hexyl, octyl, decyl, dodecyl, hexadecyl, and the like.

Examples of the alkoxy having 1 to 16 carbon atoms include methoxy, ethoxy, propoxy, isopropoxy, butoxy, tert-butoxy, pentyloxy, hexyloxy, isopentyloxy, decyloxy, dodecyloxy, hexadecyloxy, and the like, Examples of the haloalkyl having 1 to 8 carbon atoms include trifuoromethyl, perfluoroethyl, perfluoropropyl, perfluoroisopropyl, perfluorobutyl, perfluoroisobutyl, perfluoro-sec-butyl, perfluoro-tert-butyl, perfluorooctyl, and the like.

Examples of halogen include fluorine, chlorine, bromine, iodine, and the like.

Examples of aryl having 6 to 12 carbon atoms include phenyl, tolyl, methoxyphenyl, naphtyl and the like.

Examples of the aralkyl having 7 to 12 carbon atoms include benzyl, chlorobenzyl, methoxybenzyl, and the like.

Examples of the alkylthio having 1 to 4 carbon atoms include methylthio, ethylthio, propylthio, isopropylthio, butylthio, t-butylthio, and the like.

Examples of the alkylsulfonyl having 1 to 4 carbon atoms include methylsulfonyl, ethylsulfonyl, propylsulfonyl, isopropylsulfonyl, butylsulfonyl, t-butylsulfonyl, and the like.

When two or more of $Q^1$, $Q^2$, $Q^3$, $Q^4$ and $Q^5$ are the groups of the formula (VI'), the groups of the formula (VI') may be identical or different.

Examples of X include the followings:

—CH$_2$— (a-1)

—CH$_2$—CH$_2$— (a-2)

—CH$_2$—CH$_2$—CH$_2$— (a-3)

—CH$_2$—CH$_2$—CH$_2$—CH$_2$— (a-4)

—CH$_2$—CH$_2$—CH$_2$—CH$_2$—CH$_2$— (a-5)

—CH$_2$—CH$_2$—CH$_2$—CH$_2$—CH$_2$—CH$_2$— (a-6)

—CH$_2$—CH$_2$—CH$_2$—CH$_2$—CH$_2$—CH$_2$—CH$_2$—CH$_2$— (a-7)

—CH$_2$—O— (a-8)

—CH$_2$—O—CH$_2$— (a-9)

—CH$_2$—O—CH$_2$—CH$_2$— (a-10)

—CH$_2$—CH$_2$O—CH$_2$—CH$_2$— (a-11)

—CH$_2$—S— (a-12)

—CH$_2$—S—CH$_2$— (a-13)

—CH$_2$—S—CH$_2$—CH$_2$— (a-14)

—CH$_2$—CH$_2$—S—CH$_2$—CH$_2$— (a-15)

As X, (a-1) to (a-7) above are preferred.

Examples of Cy$^1$ include the followings:

 (b-1)

 (b-2)

 (b-3)

 (b-4)

 (b-5)

 (b-6)

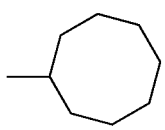

-continued

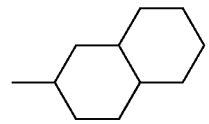 (b-11)

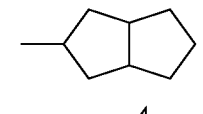 (b-12)

(b-13)

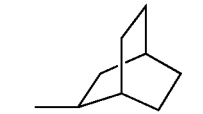 (b-14)

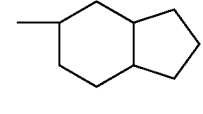 (b-15)

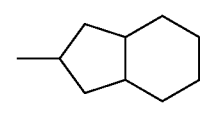 (b-16)

(b-21)

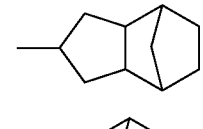 (b-22)

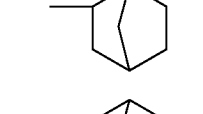 (b-23)

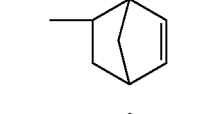 (b-24)

 (b-25)

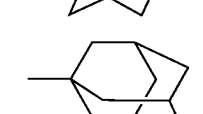 (b-26)

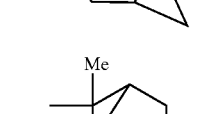

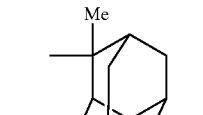

As Cy$^1$, cyclohexyl (b-4), 2-norbornyl (b-21), 1-adamantyl (b-24) and 2-adamantyl (b-23) are preferred.

Specific examples of anion of the formula (VI) include the followings:

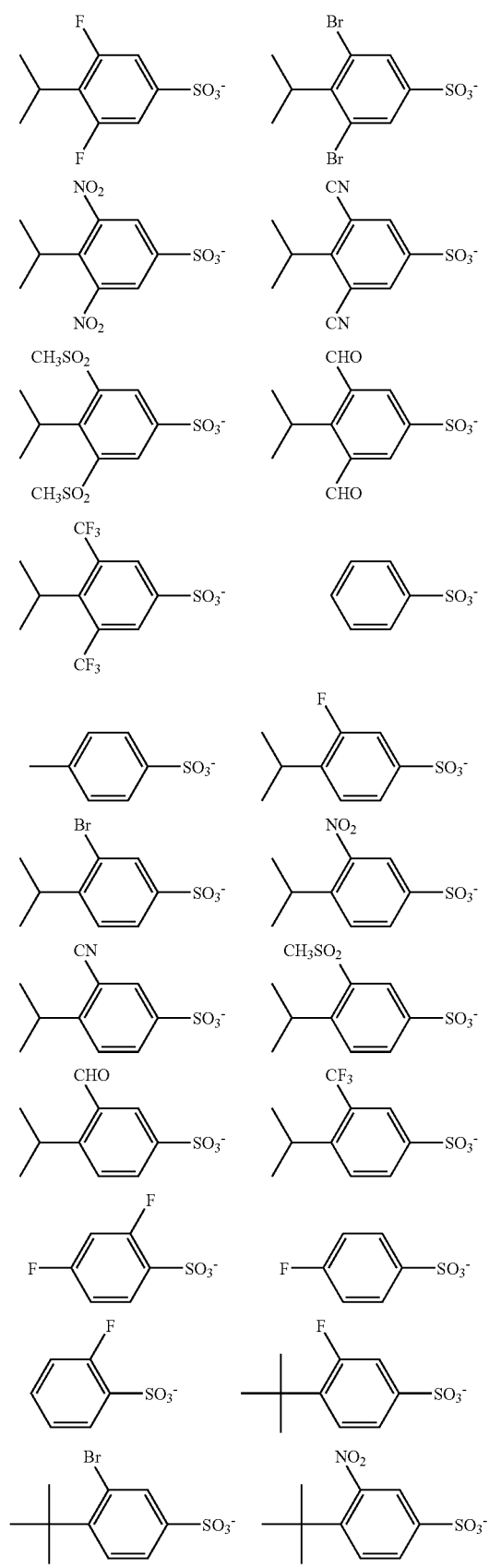
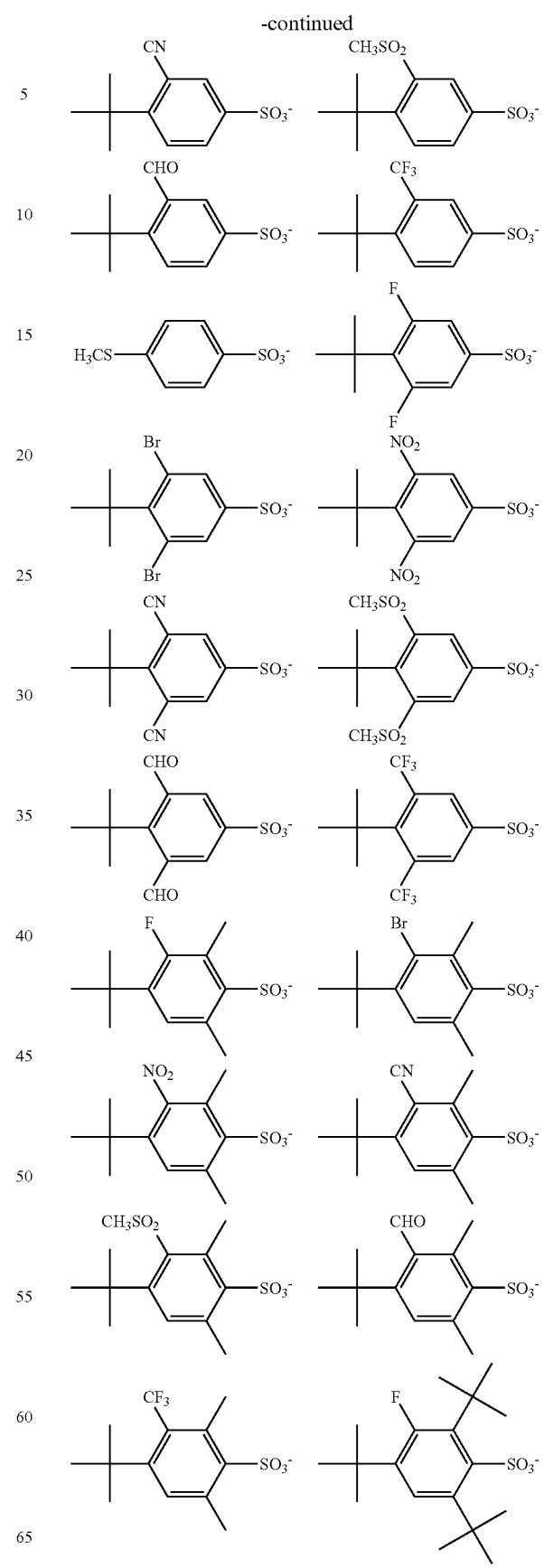

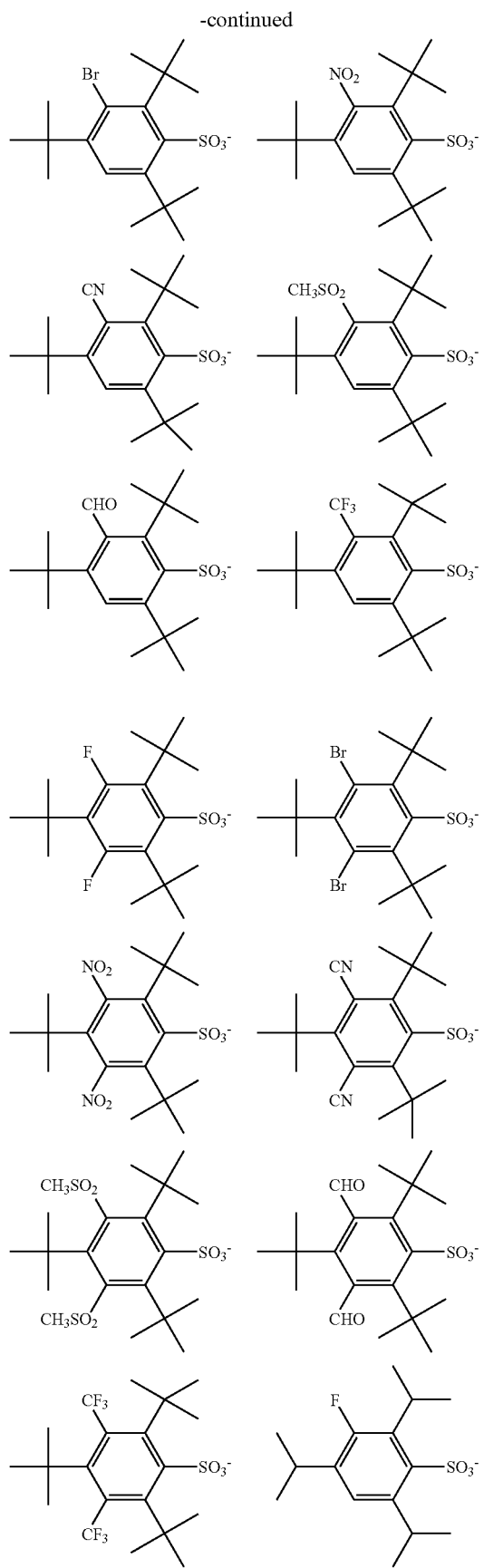
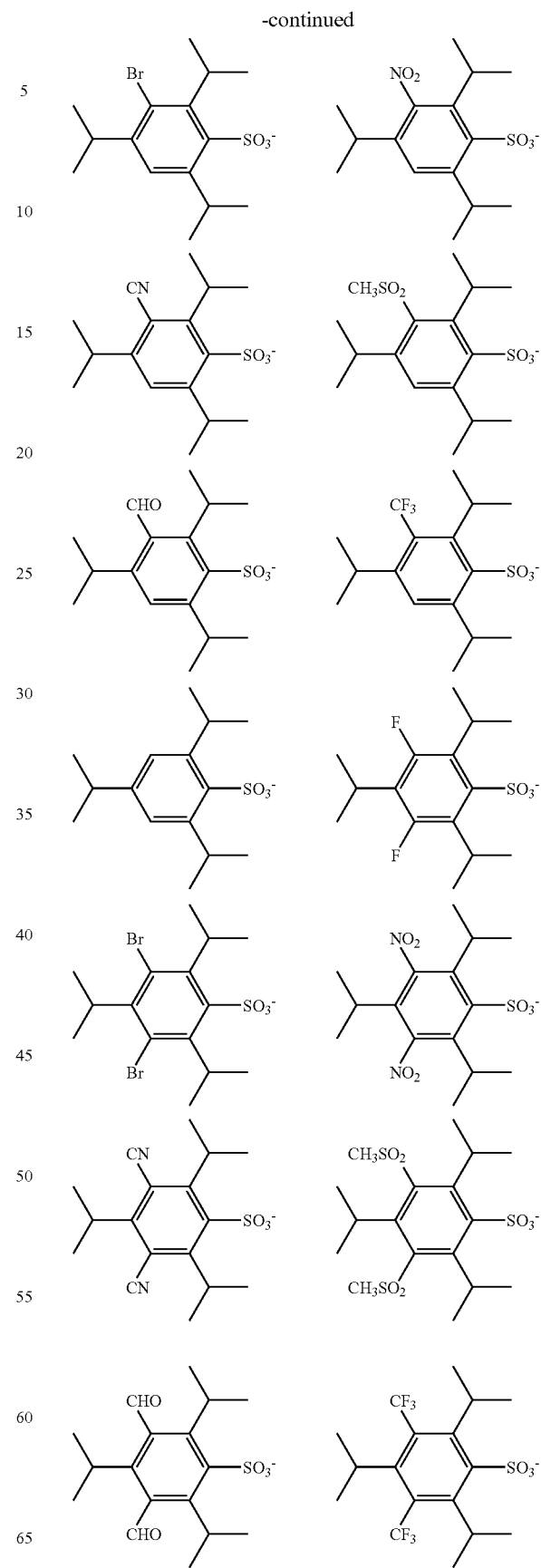

-continued
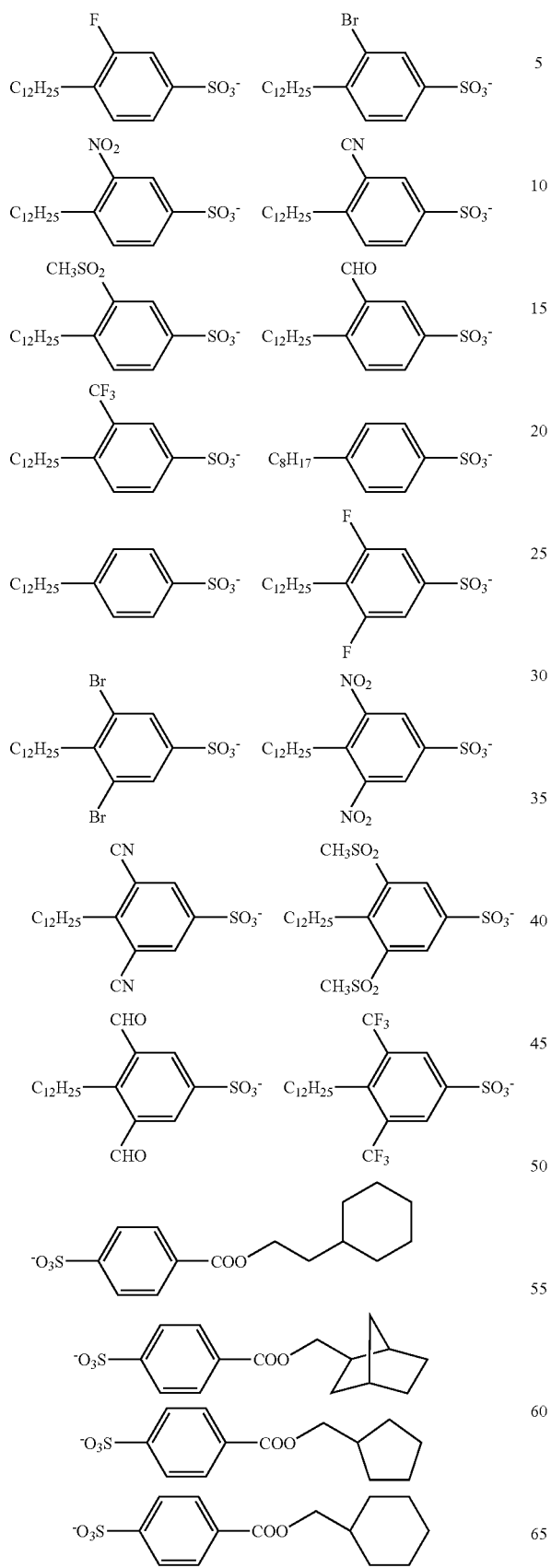
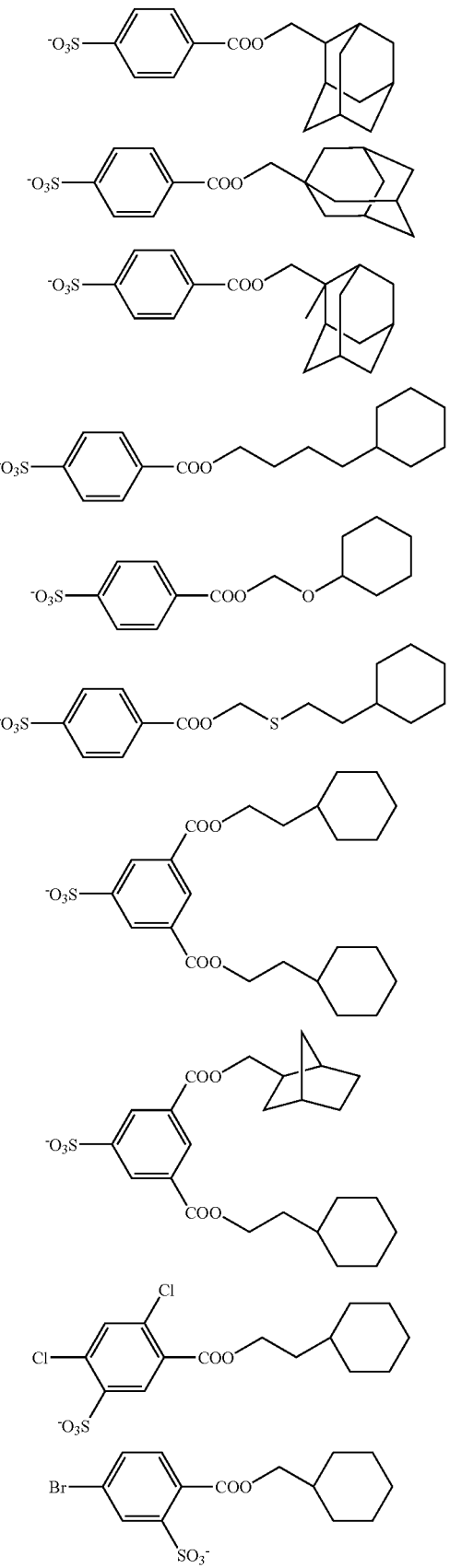

-continued
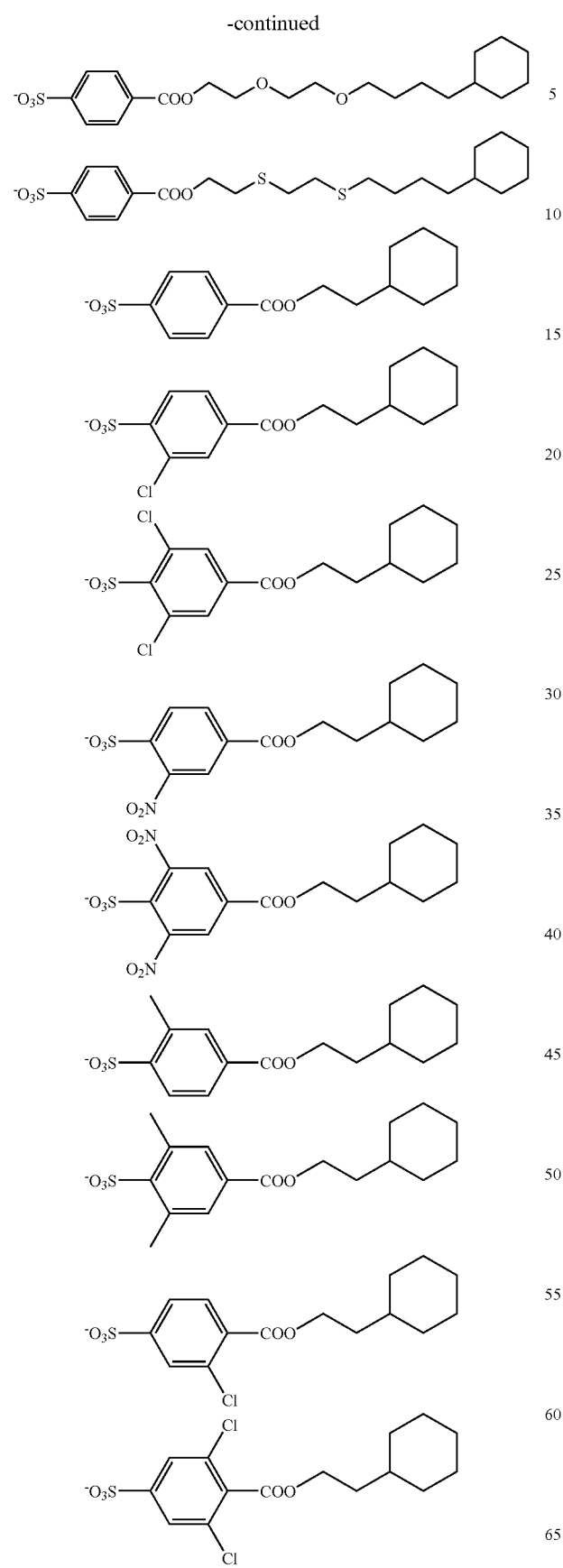
-continued
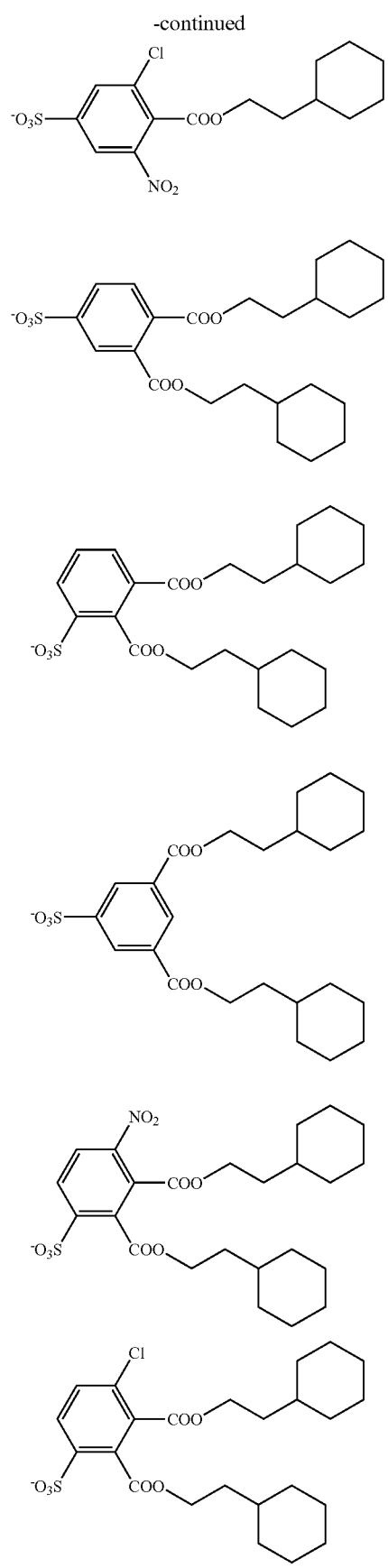

-continued

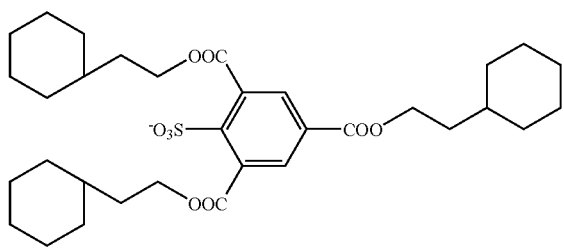

Examples of the other counter anions than the anion of the formula (VI) include an anion of the formula (VIIa)

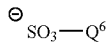 (VIIa)

wherein $Q^6$ represents perfluoroalkyl having 1 to 20 carbon atoms, optionally substituted naphtyl having 10 to 20 carbon atoms or optionally substituted anthryl having 10 to 20 carbon atoms and an anion of the formula (VIIb)

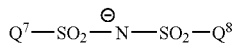 (VIIb)

wherein $Q^7$ and $Q^8$ each represent perfluoroalkyl having 1 to 20 carbon atoms or optionally substituted aromatic group having 6 to 20 carbon atoms.

Specific examples of anion of the formula (VIIa) include the followings:

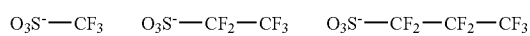
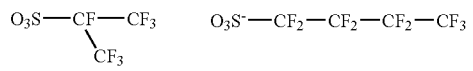
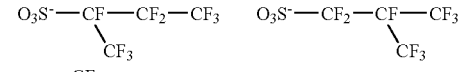
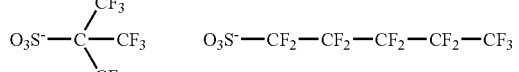
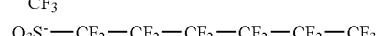
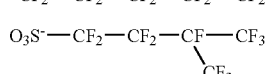
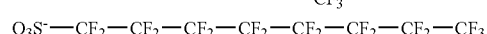
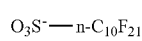
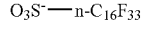
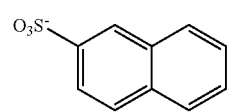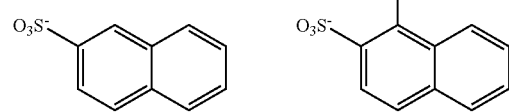

-continued

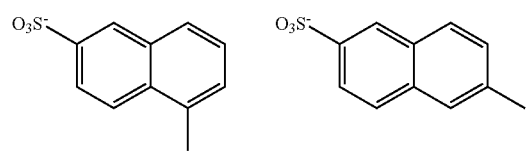
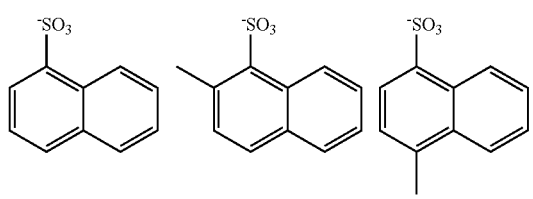
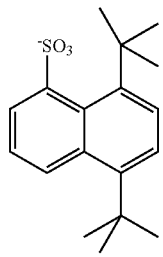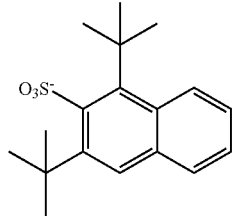
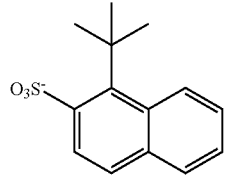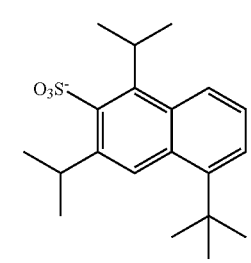
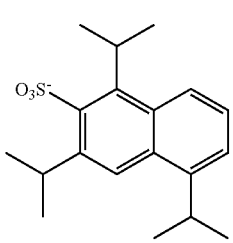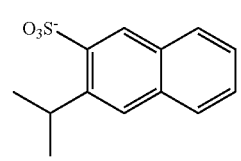
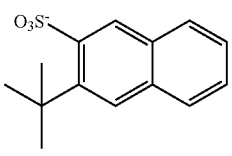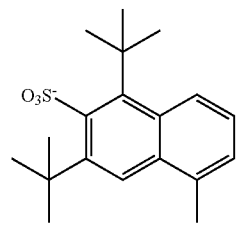

Specific examples of anion of the formula (VIIb) include the followings:

-continued

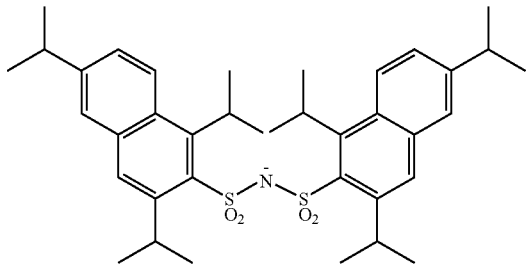

Specific examples of counter anions other than the anions of the formulae (VI), (VIIa) and (VIIb) include trifluoromethanesulfonate, perfluorobutanesulfonate, perfluorooctanesulfonate, hexafluoroantimonate, tetrafluoroborate, hexafluorophosphate, and the like.

The acid generator in the present resist composition can be used commercially available products, or can be produced by conventionally known method. For example, when Z⁻ is an anion of the formula (VI), the sulfonium salt of the formula (Va), the iodonium salt of the formula (Vb) and the sulfonium salt of the formula (Vc) can be produced according to conventional methods as shown below.

The sulfonium salt of the formula (Va) can be produced, for example, by a method reacting corresponding triphenylsulfonium bromide with silver salt of sulfonic acid having the same structure of anion part of the intended sulfonate; a method reacting corresponding aryl grignard reagent with thionyl chloride, reacting the product with triorganosilyl halide to obtain triarylsulfonium halide, and then reacting the triarylsulfonium halide with silver salt of sulfonic acid having the same structure of anion part of the intended sulfonium salt according to the method described in JP-H08-311018-A; and the like. The sulfonate in which $P^1$, $P^2$ or $P^3$ in the formula (Va) is hydroxy, can be produced by reacting triphenylsulfonium salt having tert-butoxy on its benzene ring with sulfonic acid having the same structure of anion part of the intended sulfonium salt according to the method described in JP-H08-157451-A.

The sulfonium salt of the formula (Vc) can be produced, for example, by a method reacting corresponding β-haloketone with corresponding sulfide compound to obtain corresponding sulfonium halide, and then reacting the corresponding sulfonium halide and corresponding sulfonic acid or metal salt thereof having the same structure of anion part of the intended sulfonium salt applying the method described in J. Polymer Science, Polymer Chemistry Edition, Vol. 17, 2877–2892 (1979) written by J. V. Crivello et al.

The iodonium salt of the formula (Vb) can be produced, for example, by a method reacting iodosyl sulfate with corresponding aryl compound, and then adding thereto corresponding sulfonic acid having the same structure of anion part of the intended iodonium salt according to a method described in J. Am. Chem. Soc., vol. 81, 342 (1959); a method adding iodine and trifluoro acetic acid to a mixture of acetic anhydride and fuming nitric acid, then reacting the reaction mixture and corresponding aryl compound, and then adding thereto corresponding sulfonic acid having the same structure of anion part of the intended iodonium salt; a method reacting a mixture of corresponding aryl compound, acetic anhydride and potassium iodate by adding drop-wise concentrated sulfuric acid thereto, and then adding thereto corresponding sulfonic acid having the same structure of anion part of the intended iodonium salt according to a method described in JP-H09-179302-A; and the like.

In the present composition, performance deterioration caused by inactivation of acid which occurs due to post exposure delay can be diminished by adding basic compounds, particularly, basic nitrogen-containing organic compounds, for example, amines as a quencher.

Specific examples of such basic nitrogen-containing organic compounds include the ones represented by the following formulae:

[3]

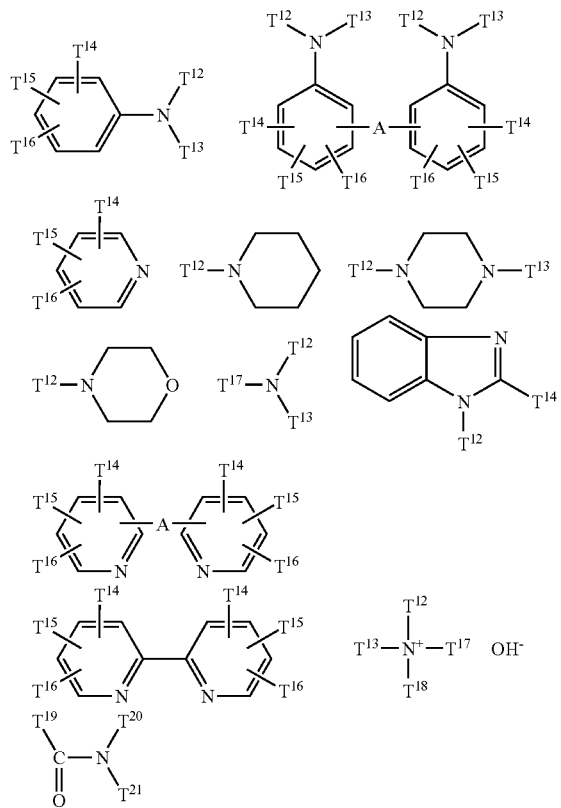

In the formulae, $T^{12}$ and $T^{13}$ each independently represent hydrogen, alkyl, cycloalkyl or aryl. The alky preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted with hydroxyl group, amino group, or alkoxy group having 1 to 6 carbon atoms. At least one hydrogen on the amino group each independently may be substituted with alkyl group having 1 to 4 carbon atoms.

$T^{14}$, $T^{15}$ and $T^{16}$ each independently represent hydrogen, alkyl, cycloalkyl, aryl or alkoxy. The alkyl preferably has about 1 to 6 carbon atoms, the cycloalkyl preferably has about 5 to 10 carbon atoms, the aryl preferably has about 6 to 10 carbon atoms, and the alkoxy preferably has about 1 to 6 carbon atoms. Furthermore, at least one hydrogen on the alkyl, cycloalkyl, aryl or alkoxy each independently may be substituted with hydroxyl group, amino group, or alkoxy group having 1 to 6 carbon atoms. At least one hydrogen on the amino group may be substituted with alkyl group having 1 to 4 carbon atoms.

$T^{17}$ represents alkyl or cycloalkyl. The alkyl preferably has about 1 to 6 carbon atoms, and the cycloalkyl preferably has about 5 to 10 carbon atoms. Furthermore, at least one hydrogen on the alkyl or cycloalkyl may each independently be substituted with hydroxyl group, amino group, or alkoxy group having 1 to 6 carbon atoms. At least one hydrogen on the amino group may be substituted with alkyl group having 1 to 4 carbon atoms.

In the formulae, $T^{18}$ represents alkyl, cycloalkyl or aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted with hydroxyl group, amino group, or alkoxy group having 1 to 6 carbon atoms. At least one hydrogen on the amino group each independently may be substituted with alkyl group having 1 to 4 carbon atoms.

However, none of $T^{12}$ and $T^{13}$ in the compound represented by the above formula [3] is hydrogen.

A represents alkylene, carbonyl, imino, sulfide or disulfide. The alkylene preferably has about 2 to 6 carbon atoms.

Moreover, among $T^{12}$–$T^{18}$, in regard to those which can be straight-chained or branched, either of these may be permitted.

$T^{19}$, $T^{20}$ and $T^{21}$ each independently represent hydrogen, alkyl having 1 to 6 carbon atoms, aminoalkyl having 1 to 6 carbon atoms, hydroxyalkyl having 1 to 6 carbon atoms or substituted or unsubstituted aryl having 6 to 20 carbon atoms, or $T^{19}$ and $T^{20}$ bond to form alkylene which forms a lactam ring together with adjacent —CO—N—.

Examples of such compounds include hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-isopropylaniline, imidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(2-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "choline"), N-methylpyrrolidone, dimethylimidazole, and the like.

Furthermore, hindered amine compounds having piperidine skeleton as disclosed in JP-A-H11-52575 can be used as quencher.

It is preferable that the present composition contains Resin Component in an amount of about 80 to 99.9% by weight and the acid generator in an amount of 0.1 to 20% by weight based on the total solid content of the present composition.

When basic compound is used as a quencher, the basic compound is contained preferably in an amount of about 0.001 to 1 part by weight, more preferably in an amount of about 0.01 to 0.3 part by weight based on 100 parts by weight of Resin Component.

The present composition can contain, if necessary, various additives in small amount such as a sensitizer, solution suppressing agent, other resins, surfactant, stabilizer, dye and the like, as long as the effect of the present invention is not prevented.

The present composition is usually in the form of a resist liquid composition in which the aforementioned ingredients are dissolved in a solvent, and the resist liquid composition is to be applied onto a substrate such as a silicon wafer by a conventional process such as spin coating. The solvent used here is sufficient to dissolve the aforementioned ingredients, have an adequate drying rate, and give a uniform and smooth coat after evaporation of the solvent and, hence, solvents generally used in the art can be used. In the present invention, the total solid content means total content exclusive of solvents.

Examples thereof include glycol ether esters such as ethyl Cellosolve acetate, methyl Cellosolve acetate and propylene glycol monomethyl ether acetate; esters such as ethyl lactate, butyl lactate, amyl lactate and ethyl pyruvate and the like; ketones such as acetone, methyl isobutyl ketone, 2-heptanone and cyclohexanone; cyclic esters such as γ-butyrolactone, and the like. These solvents can be used each alone or in combination of two or more.

A resist film applied onto the substrate and then dried is subjected to exposure for patterning, then heat-treated for facilitating a deblocking reaction, and thereafter developed with an alkali developer. The alkali developer used here may be any one of various alkaline aqueous solutions used in the art, and generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended Claims, and includes all variations of the equivalent meanings and ranges to the Claims.

The present invention will be described more specifically by way of examples, which are not construed to limit the scope of the present invention. The "%" and "part(s)" used to represent the content of any component and the amount of any material used in the following examples are on a weight basis unless otherwise specifically noted. The weight-average molecular weight of any material used in the following examples is a value found by gel permeation chromatography using styrene as a standard reference material.

EXAMPLE 1

Synthesis of Resin A1

8.50 g of 2-isopropyl-2-adamantyl methacrylate, 4.80 g of 3-hydroxy-1-adamantyl acrylate and 11.24 g of 5-acryloyloxy-2,6-norbornenelactone (molar ratio of 30:20:50) were charged into a flask, and dioxane in 2,6 times weight based on all monomers was added, and then to the solution was added azobisisobutyronitrile as an initiator in a ratio of 3 mol % based on all monomer molar amount. The mixture was heated at 85° C. for about 5 hours. Then, operation of pouring into large amount of solvent mixture consisting of methanol and water to cause crystallization was repeated three times, and then dried to obtain of copolymer having an weight average molecular weight of 10000 in the yield of 76%. This is called resin A1. Resin A1 has substantially the same ratio of structural units as that of the monomers added.

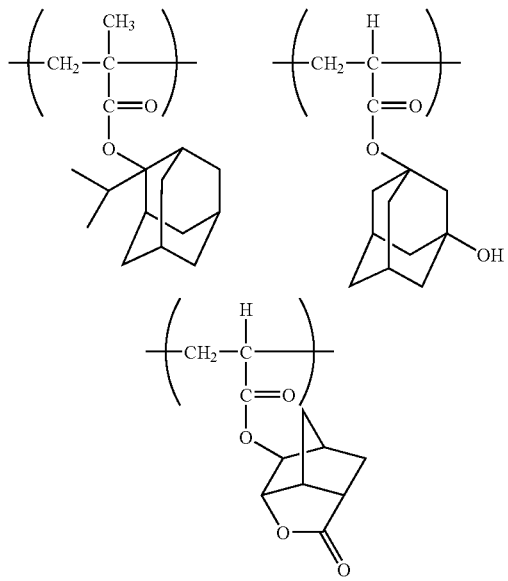

EXAMPLE 2

Synthesis of Resin A2

8.50 g of 2-ethyl-2-adamantyl methacrylate, 5.07 g of 3-hydroxy-1-adamantyl acrylate and 11.87 g of 5-acryloyloxy-2,6-norbornenelactone (molar ratio of 30:20:50) were charged into a flask, and dioxane in 2.6 times weight based on all monomers was added, and then to the solution was added azobisisobutyronitrile as an initiator in a ratio of 3 mol % based on all monomer molar amount. The mixture was heated at 85° C. for about 5 hours. Then, operation of pouring into large amount of solvent mixture consisting of methanol and water to cause crystallization was repeated three times, and then dried to obtain of copolymer having an weight average molecular weight of 10000 in the yield of 82%. This is called resin A2. Resin A2 has substantially the same ratio of structural units as that of the monomers added.

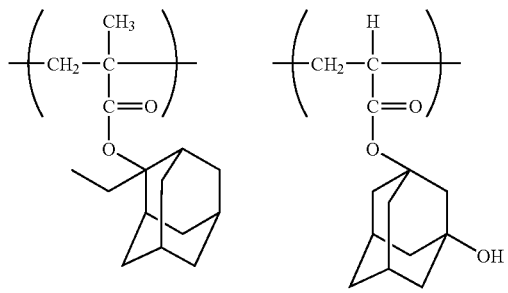

-continued

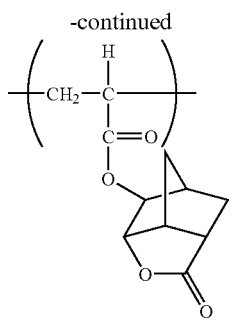

EXAMPLES 3 TO 5 AND COMPARATIVE EXAMPLES 1 TO 3

The following components were mixed and dissolved, further, filtrated through a fluorine resin filter having pore diameter of 0.2 μm, to prepare resist liquid.

<Acid Generator>
B1: 0.215 part of 2-oxo-2-phenylethyl-thiacyclopentanium perfluorobutanesulfonate
B2: 0.26 part of p-tolyldiphenylsulfonium perfluoro-N-[(perfluoroethyl)sulfonyl]-1-ethanesulfoneamidate <Resin>
Kind and amount are described in Table 1.

<Quencher>
C1: 0.0075 part of 2,6-diisopropylaniline

<Solvent>
33.25 parts of propylene glycol monomethyl ether acetate, 33.25 parts of heptanone and 3.5 parts of γ-butyrolactone Silicon wafers were each coated with "ARC-29A-8", which is an organic anti-reflective coating composition available from Brewer Co., and then baked under the conditions: 215° C., 60 seconds, to form a 780 Å-thick organic anti-reflective coating. Each of the resist liquids prepared as above was spin-coated over the anti-reflective coating so that the thickness of the resulting film became 0.27 μm after drying. The silicon wafers thus coated with the respective resist liquids were each prebaked on a direct hotplate at temperature shown in "PB" column in Table 1 for 60 seconds. Using an ArF excimer stepper ("NSR ArF" manufactured by Nicon Corporation, NA=0.55 2/3 Annular), each wafer thus formed with the respective resist film was subjected to line and space pattern exposure, with the exposure quantity being varied stepwise.

After the exposure, each wafer was subjected to post-exposure baking on a hotplate at temperature shown in "PEB" column in Table 1 for 60 seconds and then to paddle development for 60 seconds with an aqueous solution of 2.38 wt % tetramethylammonium hydroxide.

A bright field pattern developed on the organic anti-reflective coating substrate was observed with a scanning electron microscope, the results of which are shown in Table 2. The term "bright field pattern", as used herein, means a pattern obtained by exposure and development through a reticle comprising an outer frame made of a chromium layer (light-shielding layer) and linear chromium layers (light-shielding layers) formed on a glass surface (light-transmitting portion) extending inside the outer frame. Thus, the bright field pattern is such that, after exposure and development, resist layer surrounding the line and space pattern is removed while resist layer corresponding to the outer frame is left on the outer side of the region from which the resist layer is removed.

Effective Sensitivity:

It is expressed as the amount of exposure that the line pattern (light-shielding layer) and the space pattern (light-transmitting layer) become 1:1 after exposure through 0.13 μm line and space pattern mask and development.

Resolution:

It is expressed as the minimum size of space pattern which gave the space pattern split by the line pattern at the exposure amount of the effective sensitivity.

TABLE 1

| Example No. | Resin/ (Parts) | Acid generator (Parts) | Quencher | PB | PEB |
|---|---|---|---|---|---|
| Example 3 | A1(10) | B1(0.215) B2(0.26) | C1(0.01) | 130° C. | 90° C. |
| Example 4 | A1(10) | B1(0.215) B2(0.26) | C1(0.01) | 130° C. | 100° C. |
| Example 5 | A1(10) | B1(0.215) B2(0.26) | C1(0.01) | 130° C. | 110° C. |
| Comparative Example 1 | A2(10) | B1(0.215) B2(0.26) | C1(0.01) | 130° C. | 90° C. |
| Comparative Example 2 | A2(10) | B1(0.215) B2(0.26) | C1(0.01) | 130° C. | 100° C. |
| Comparative Example 3 | A2(10) | B1(0.215) B2(0.26) | C1(0.01) | 130° C. | 110° C. |

TABLE 2

| Example No. | Effective Sensitivity (mJ/cm$^2$) | Resolution (μm) |
|---|---|---|
| Example 3 | 29 | 0.13 |
| Example 4 | 15 | 0.13 |
| Example 5 | 8 | 0.13 |
| Comparative Example 1 | 44 | >0.20 |
| Comparative Example 2 | 19 | 0.13 |
| Comparative Example 3 | 10 | 0.13 |

The chemical amplification type positive resist composition of the present invention gives resist patterns having remarkably improved sensitivity, and excellent resist abilities such as resolution and the like. Therefore, it is suitable for excimer laser lithography using ArF, KrF and the like, has large industrial values.

What is claimed is:

1. A chemical amplification type positive resist composition comprising
  (A) a resin which comprises (1) at least one structural unit selected from the group consisting of a structural unit derived from 3-hydroxy-1-adamantyl (meth)acrylate, a structural unit derived from 3,5-dihydroxy-1-adamantyl (meth)acrylate, a structural unit derived from (meth)acryloyloxy-γ-butyrolactone having a lactone ring optionally substituted by alkyl, a structural unit of the formula (Ia) and a structural unit of the following formula (Ib)

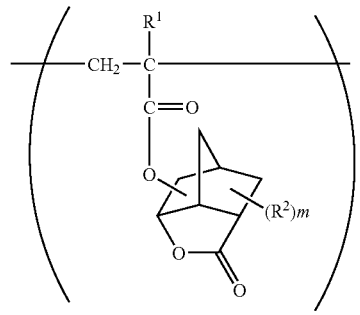

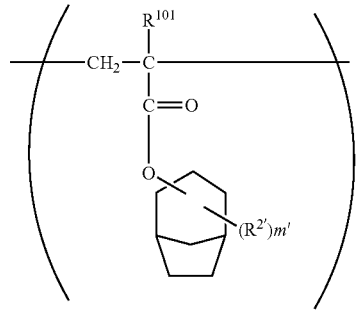

wherein $R^1$ and $R^{101}$ each independently represent hydrogen or methyl, $R^2$ and $R^{2'}$ each independently represent methyl or ethyl, m and m' each independently represent an integer of 0 to 3, and when m is 2 or 3, each of $R^2$ is same or different, and when ' is 2 or 3, each of $R^{2'}$ is same or different, and (2) a structural unit of the formula (II)

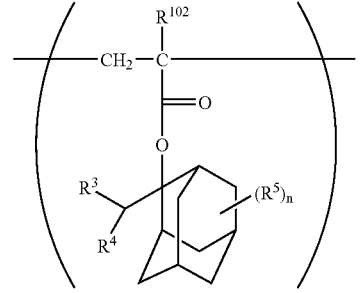

wherein $R^{102}$ represents hydrogen or methyl, $R^3$ and $R^4$ each independently represent methyl or ethyl, $R^5$ represents methyl, halogen or hydroxyl, n represents an integer of 0 to 14, and when n is 2 or more, each of $R^5$ is same or different, and which itself is insoluble or poorly soluble in an alkali aqueous solution but becomes soluble in an alkali aqueous solution by the action of an acid, and (B) an acid generator selected from the group consisting of a sulfonium salt of the formula (Va)

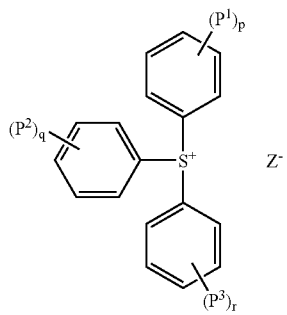

(Va)

wherein P¹ to P³ each independently represent hydroxyl, alkyl having 1 to 6 carbon atoms or alkoxy having 1 to 6 carbon atoms, p, q and r each independently represent an integer of 0 to 3, when p is 2 or more, each of P¹ is same or different, when q is 2 or more, each of P² is same or different, when r is 2 or more, each of P³ is same or different, and Z– represents an anion of the formula VI

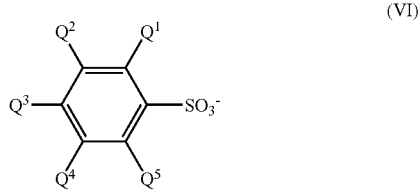

(VI)

wherein $Q^1$, $Q^2$, $Q^3$, $Q^4$ and $Q^5$ each independently represent hydrogen, alkyl having 1 to 16 carbon atoms, alkoxy having 1 to 16 carbon atoms, halogen, haloalkyl having 1 to 8 carbon atoms, aryl having 6 to 12 carbon atoms, aralkyl having 7 to 12 carbon atoms, cyano, alkylthio having 1 to 4 carbon atoms, alkylsulfonyl having 1 to 4 carbon atoms, hydroxyl, nitro or a group of the formula (VI')

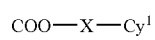

(VI')

wherein X represents alkylene and at least one —CH$_2$— in the alkylene may be substituted by —O— or —S—, Cy¹ represents alicyclic hydrocarbon having 3 to 20 carbon atoms, with the proviso that at least one of $Q^1$, $Q^2$, $Q^3$, $Q^4$ and is a group of the formula (VI'); an iodonium salt of the formula (Vb)

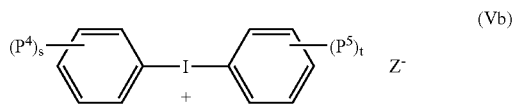

(Vb)

wherein $P^4$ and $P^5$ each independently represent hydroxyl, alkyl having 1 to 6 carbon atoms or alkoxy having 1 to 6 carbon atoms, s and t each independently represent 0 or 1, and Z⁻ has the same meaning as defined above, and a sulfonium salt of the formula (Vc)

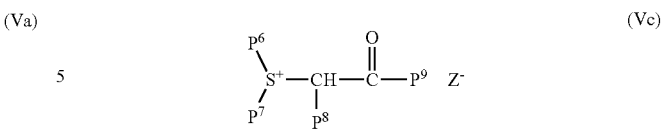

(Vc)

wherein $P^6$ and $P^7$ each independently represent alkyl having 1 to 6 carbon atoms or cycloalkyl having 3 to 10 carbon atoms, or $P^6$ and $P^7$ bond to form divalent acyclic hydrocarbon having 3 to 7 carbon atoms which forms a ring together with the adjacent S⁺, and at least one —CH$_2$— in the divalent acyclic hydrocarbon may be substituted by —CO—, —O— or —S—, $P^8$ represents hydrogen, $P^9$ represents alkyl having 1 to 6 carbon atoms, cycloalkyl having 3 to 10 carbon atoms or aromatic ring group optionally substituted, or $P^8$ and $P^9$ bond to form 2-oxocycloalkyl together with the adjacent —CHCO—, and Z⁻ has the same meaning as defined above.

2. The composition according to claim 1 wherein the content of the structural unit of the formula (II) in all structural units of the resin is from 10 to 80% by mol.

3. The resin according to claim 1 wherein the resin further contains a structural unit derived from 2-norbornene and a structural unit derived from an aliphatic unsaturated dicarboxylic anhydride.

4. The resin according to claim 1 wherein the resin further contains a structural unit of the formula (III)

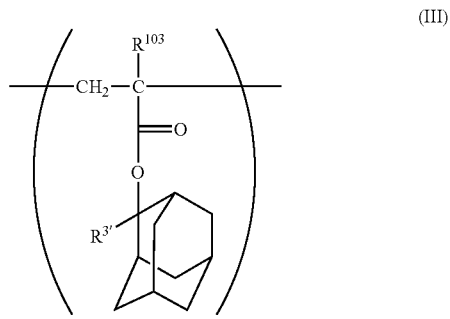

(III)

wherein $R^{103}$ represents hydrogen or methyl and $R^{3'}$ represents methyl or ethyl.

5. The resin according to claim 1 wherein the resin further contains a structural unit of the formula (IV)

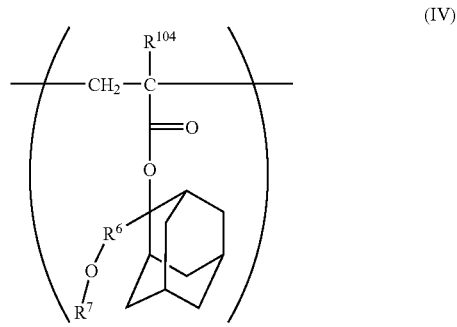

(IV)

wherein $R^{104}$ represents hydrogen or methyl, and $R^6$ and $R^7$ each independently represent alkyl having 1 to 4 carbon atoms.

6. The composition according to claim 1 wherein the content of the resin is 80 to 99.9% by weight and the content of the acid generator is 0.1 to 20% by weight based on the total amount of the resin and the acid generator.

7. The composition according to claim 1 wherein the composition further comprises basic nitrogen-containing organic compound as a quencher.

8. The composition according to claim 7 wherein the content of the basic nitrogen-containing organic compound is 0.001 to 1 part by weight per 100 parts by weight of the resin.

* * * * *